United States Patent
Osaka

(10) Patent No.: US 12,275,601 B2
(45) Date of Patent: Apr. 15, 2025

(54) WAFER TRANSFER APPARATUS AND WAFER TRANSFER METHOD

(71) Applicant: RORZE CORPORATION, Hiroshima (JP)

(72) Inventor: Kouta Osaka, Hiroshima (JP)

(73) Assignee: RORZE CORPORATION, Hiroshima (JP)

(*) Notice: Subject to any disclaimer, the term of this patent is extended or adjusted under 35 U.S.C. 154(b) by 0 days.

(21) Appl. No.: 18/073,559

(22) Filed: Dec. 2, 2022

(65) Prior Publication Data

US 2023/0119986 A1 Apr. 20, 2023

Related U.S. Application Data

(63) Continuation of application No. PCT/JP2020/032560, filed on Aug. 28, 2020.

(30) Foreign Application Priority Data

Jun. 5, 2020 (JP) ................. 2020-098090

(51) Int. Cl.
*H01L 21/68* (2006.01)
*B65G 47/90* (2006.01)

(52) U.S. Cl.
CPC ............. *B65G 47/90* (2013.01); *H01L 21/68* (2013.01)

(58) Field of Classification Search
CPC ........ H01L 21/68; H01L 21/681; B65G 47/90
See application file for complete search history.

(56) References Cited

U.S. PATENT DOCUMENTS

| 5,456,561 | A | * | 10/1995 | Poduje | ..................... | B25J 9/042 |
| | | | | | | 901/6 |
| 5,604,443 | A | | 2/1997 | Kitamura et al. | | |
| 6,166,509 | A | * | 12/2000 | Wyka | .................. | G05B 19/404 |
| | | | | | | 414/936 |
| 2003/0070915 | A1 | * | 4/2003 | Kao | ........................ | C23C 14/56 |
| | | | | | | 204/192.12 |

(Continued)

FOREIGN PATENT DOCUMENTS

CN 101019220 A 8/2007
CN 101783305 A 7/2010

(Continued)

OTHER PUBLICATIONS

International Search Report in PCT/JP2020/032560 mailed Nov. 17, 2020, 7pp.

(Continued)

*Primary Examiner* — Gerald McClain
(74) *Attorney, Agent, or Firm* — HAUPTMAN HAM, LLP

(57) ABSTRACT

An object of the invention is to realize a high transfer throughput in a wafer transfer apparatus in which a wafer transfer robot transfers a wafer via an aligner. A wafer transfer apparatus includes a wafer transfer robot, and a separation dimension between a pair of wafer holding rods forming a finger of the wafer transfer robot is set to be larger than a dimension of a body portion of an aligner in a width direction provided in the wafer transfer apparatus. In addition, an elevating mechanism provided in the wafer transfer apparatus is configured to be able to move the finger to below the body portion of the aligner, thereby achieving the object of the invention.

20 Claims, 16 Drawing Sheets

(56) References Cited

U.S. PATENT DOCUMENTS

| | | | |
|---|---|---|---|
| 2005/0078312 A1 | 4/2005 | Fukuzaki et al. | |
| 2006/0039781 A1 | 2/2006 | Niewmierzycki et al. | |
| 2006/0045664 A1 | 3/2006 | Niewmierzycki et al. | |
| 2007/0175864 A1 | 8/2007 | Niewmierzycki et al. | |
| 2008/0025824 A1 | 1/2008 | Hashimoto | |
| 2014/0151195 A1 | 6/2014 | Niewmierzycki | |
| 2015/0179488 A1 | 6/2015 | Blank | |
| 2016/0088779 A1* | 3/2016 | Ahn | H01L 21/67092 29/700 |
| 2018/0143541 A1 | 5/2018 | Liu et al. | |
| 2018/0294175 A1* | 10/2018 | Ahamed | H01L 21/68 |
| 2020/0083086 A1 | 3/2020 | Yoshida et al. | |
| 2020/0343119 A1* | 10/2020 | Bergantz | H01L 21/67781 |
| 2021/0327737 A1 | 10/2021 | Sakata et al. | |
| 2021/0366753 A1* | 11/2021 | Bergantz | B65G 47/90 |

FOREIGN PATENT DOCUMENTS

| | | | | |
|---|---|---|---|---|
| JP | H07-321165 A | | 12/1995 | |
| JP | 2023-068620 A | | 3/2003 | |
| JP | 2003152055 A | * | 5/2003 | H01L 21/68 |
| JP | 200828134 A | | 2/2008 | |
| JP | 2010199478 A | * | 9/2010 | |
| JP | 2012084802 A | * | 4/2012 | H01L 21/67265 |
| JP | 20204839 A | | 1/2020 | |
| JP | 202013814 A | | 1/2020 | |
| JP | 2020004839 A | * | 1/2020 | H04B 3/03 |
| KR | 10-2007-0047605 A | | 5/2007 | |
| KR | 1845797 B1 | * | 4/2018 | B65G 47/902 |
| TW | 201539609 A | | 10/2015 | |
| WO | 2008029608 A1 | | 3/2008 | |
| WO | WO-2020054386 A1 | * | 3/2020 | B25J 11/0095 |

OTHER PUBLICATIONS

Office Action in TW Application No. 109130045 dated Feb. 17, 2024, 18pp.
Extended European Search Report in EP Application No. 20939059.0 dated Jun. 25, 2024, 10pp.
Office Action in KR Application No. 10-2022-7045829 mailed Jul. 9, 2024, 16pp.
Office Action in CN Application No. 202080100775.X mailed Nov. 26, 2024, 23pp.

* cited by examiner

WAFER TRANSFER APPARATUS AND WAFER TRANSFER METHOD

RELATED APPLICATIONS

The present application is a continuation of International Application No. PCT/JP2020/032560, filed Aug. 28, 2020, which claims priority from Japanese Patent Application No. 2020-098090, filed Jun. 5, 2020, the disclosures of which applications are hereby incorporated by reference here in their entirety.

TECHNICAL FIELD

The present invention relates to a wafer transfer apparatus that transfers a semiconductor wafer between clean containers or between various processing apparatuses under a clean environment, particularly to a wafer transfer apparatus including a transfer robot including wafer holding means, and an aligner that performs positioning of the semiconductor wafer, and to a wafer transfer method.

BACKGROUND ART

A semiconductor wafer (hereinafter, referred to as a wafer) is subjected to various micro-processing such as resist coating, exposure, and development of a surface by various processing equipment. For the various processing, the wafer is accommodated in a sealable clean container and is conveyed between the processing equipment in a clean environment called a clean room which is shut off from an external atmosphere and in which the amount of floating dust is small. Each processing equipment includes a wafer transfer apparatus and a processing apparatus. A front opening unified pod (FOUP) that is one of clean containers conveyed to the processing equipment is placed on a FOUP opening and closing device called a load port of the wafer transfer apparatus that is a part of the processing equipment. A wafer transfer robot is provided inside the wafer transfer apparatus, and performs delivery of the wafer between the FOUP placed on the load port and each processing apparatus. When a lid of the FOUP is opened in a state where the clean environment is maintained, a wafer W accommodated in the FOUP is extracted by the wafer transfer robot disposed in an internal space of the wafer transfer apparatus, and is transferred to the processing apparatus that performs various processing. The wafer transfer apparatus is surrounded by walls that shut the wafer transfer apparatus off from an external environment, and a fan filter unit (FFU) that supplies highly clean air to the internal space of the wafer transfer apparatus as a laminar downflow is provided on an upper portion of the wafer transfer apparatus. The internal space that is a space inside the wafer transfer apparatus in which the wafer moves is maintained at a high cleanliness by the walls and the FFU.

Patent Document 1 discloses a horizontal articulated robot (hereinafter, referred to as a "transfer robot") for transferring a wafer, which is formed of a base disposed on a processing apparatus side of a transfer space; a lower robot arm that is rotatable with respect to the base; an upper robot arm that is rotatable with respect to the lower robot arm; and a robot hand that is rotatable with respect to the upper robot arm. The upper and lower robot arms of the horizontal articulated robot have a dimension longer than ½ of a depth dimension of the transfer space formed by front and rear walls, and each robot arm and the robot hand are configured to be independently operable by individual motors. Since the robot arms are configured to be longer than ½ of the depth dimension of the transfer space in such a manner, the wafer can be transferred to a distant position without providing a linear drive mechanism between a load port and the transfer robot that are distant from each other, the linear drive mechanism moving the transfer robot in a left-right direction.

In addition, the wafer transfer apparatus of Patent Document 1 includes an aligner that adjusts a placement position of the wafer. The aligner holds the wafer transferred by the transfer robot, with holding means, and detects an offset amount of the placement position of the wafer (positional offset amount) by scanning a peripheral edge portion of the wafer with a sensor through rotating the held wafer. In addition, positioning of the wafer in a rotational direction (rotational positioning) is performed based on a result of detection of a cutout portion such as a notch or an orientation flat formed at the peripheral edge portion of the wafer.

The aligner is disposed in the transfer space similarly to the wafer transfer robot, the wafer extracted from a FOUP is transferred to the aligner for the moment before being transferred to a processing apparatus by the wafer transfer robot, and a wafer holding position of the robot arms is positioned at a predetermined position determined in advance. Thereafter, the wafer is transferred from the aligner to the processing apparatus by the wafer transfer robot. In addition, when the wafer for which processing by the processing apparatus is completed is returned to the FOUP, the wafer is transferred from the processing apparatus to the aligner by the wafer transfer robot, and an operation that the wafer is inspected by an inspection device disposed in the vicinity of the aligner and then is transferred to the FOUP is also performed.

In the wafer transfer robot described in Patent Document 1, since the upper robot arm, the lower robot arm, and the robot hand are individually and rotationally operated, the wafer can be transferred to a desired position between the FOUP on the load port, the processing apparatus, and the aligner without providing the linear drive mechanism for moving the wafer transfer robot in the left-right direction.

However, when the horizontal articulated robot described in Patent Document 1 performs a transfer operation of another wafer until the aligner completes an alignment operation after the wafer has been transferred to the aligner, the following problems occur. For transition to the transfer operation of another wafer after the wafer has been transferred to the aligner, the horizontal articulated robot has to move the robot hand to retreat such that the robot hand does not come into contact with the wafer placed on the aligner and wafer holding means, and then to start the transfer operation of the next wafer. As in the horizontal articulated robot described in Patent Document 1, when the length of the upper and lower robot arms is set to be longer than ½ of the depth dimension of the transfer space, an operation range related to the rotational operation of each of the upper and lower robot arms is limited. As a result, it takes time to operate the robot arm, and throughput decreases. Particularly, in order to effectively use a limited space inside the clean room, an occupied area of the wafer transfer apparatus is reduced as much as possible, and the transfer space itself is also configured to be narrow. For this reason, as a result, the operation range of the robot arms becomes narrow, and the movement is limited, so that the robot arms have to perform a complicated operation.

CITATION LIST

Patent Document

Patent Document 1: JP 2008-28134 A

SUMMARY OF THE INVENTION

Problem to be Solved by the Invention

The invention is conceived in view of such problems, and an object of the invention is to provide a wafer transfer apparatus capable of achieving a high transfer throughput regardless of a length of a robot arm when a wafer transfer robot transfers a wafer via an aligner. In addition, another object is to provide a wafer transfer method using the wafer transfer robot.

Means for Solving Problem

In order to solve the foregoing problems, according to the invention, there is provided a wafer transfer apparatus including: an aligner to hold a wafer on a wafer pedestal and to detect a peripheral edge portion of the wafer; and a wafer transfer robot to hold and transfer the wafer between a load port, the aligner, and a processing apparatus. The wafer transfer robot includes an arm body including at least two arms rotationally operably connected to each other at one end of each of the arms, a finger rotatably attached to a distal end of the arm body to hold the wafer, an arm body drive mechanism to operate the arm body, a finger drive mechanism to rotationally operate the finger in a horizontal plane, and an elevating mechanism to move the arm body in a vertical direction. A separation dimension between a pair of wafer holding rods provided in the finger is larger than a dimension of a body portion of the aligner in a width direction in an area where the wafer holding rods access the body portion of the aligner. The elevating mechanism has an operation range where the finger is movable to below the body portion of the aligner.

In the wafer transfer apparatus of the invention, it is preferable that a difference between the separation dimension between the pair of wafer holding rods and the dimension of the body portion in the width direction is larger than an allowable offset dimension of the wafer in the width direction. In addition, in the wafer transfer apparatus of the invention, the wafer pedestal may be a suction type wafer pedestal to suction and hold the wafer, and the finger may be a suction type finger to suction and hold the wafer.

Further, it is preferable that a pair of wafer holding pads for and a wafer contact portion for suctioning the wafer are disposed on the suction type finger, a center of the wafer held by the suction type finger is disposed inside a triangle connecting the pair of wafer holding pads and the wafer contact portion when viewed from above, and when the suction type finger is located to deliver and receive the wafer to and from the suction type wafer pedestal, a rotation center axis of the suction type wafer pedestal is disposed inside the triangle when viewed from above. In addition, the aligner may be configured to include a movement mechanism to move the suction type wafer pedestal in a horizontal plane.

In addition, in the wafer transfer apparatus of the invention, the wafer pedestal may be a clamp type wafer pedestal to pinch the peripheral edge portion of the wafer, and the finger may be a clamp type finger to pinch the peripheral edge portion of the wafer.

In addition, in order to solve the foregoing problems, according to the invention, there is provided a wafer transfer method for delivering a wafer between an aligner to hold the wafer on a wafer pedestal and to detect a peripheral edge portion of the wafer and a wafer transfer robot to hold and transfer the wafer on a finger, the method including: a step of placing the wafer held on the finger, on the wafer pedestal provided in the aligner, by causing the transfer robot to operate an arm body drive mechanism to operate an arm body, to operate a finger drive mechanism to rotate the finger in a horizontal plane, and to operate an elevating mechanism to move the arm body in a vertical direction; a step of lowering the finger to below the aligner by continuing a lowering operation of the elevating mechanism even after the wafer is placed on the wafer pedestal; and a step of retreating the finger from the aligner by operating the arm body drive mechanism and the finger drive mechanism.

In addition, the wafer transfer method of the invention further includes: a step of causing the aligner to detect a positional offset of the wafer by detecting the peripheral edge portion of the wafer held on the wafer pedestal; a step of causing the wafer transfer robot to move the finger to below the aligner by operating the arm body drive mechanism to operate the arm body, the finger drive mechanism to rotate the finger in the horizontal plane, and the elevating mechanism to move the arm body in the vertical direction; and a step of holding the wafer placed on the wafer pedestal by raising the finger moved to below the aligner, to above the wafer pedestal through an operation of the elevating mechanism. In addition, the wafer transfer method may further include a step of causing the wafer transfer robot to move the finger in a horizontal direction so as to cancel the positional offset of the wafer detected by the aligner, before the elevating mechanism is operated to raise the finger. Further, the wafer transfer method may further include a step of causing the aligner to move the wafer pedestal in a horizontal plane so as to cancel the detected positional offset of the wafer, before the wafer transfer robot operates the elevating mechanism to raise the finger.

Effect of the Invention

According to the invention, it is possible to achieve a high transfer throughput in the wafer transfer apparatus in which the wafer transfer robot transfers the wafer via the aligner.

MODE(S) FOR CARRYING OUT THE INVENTION

Figure 1:
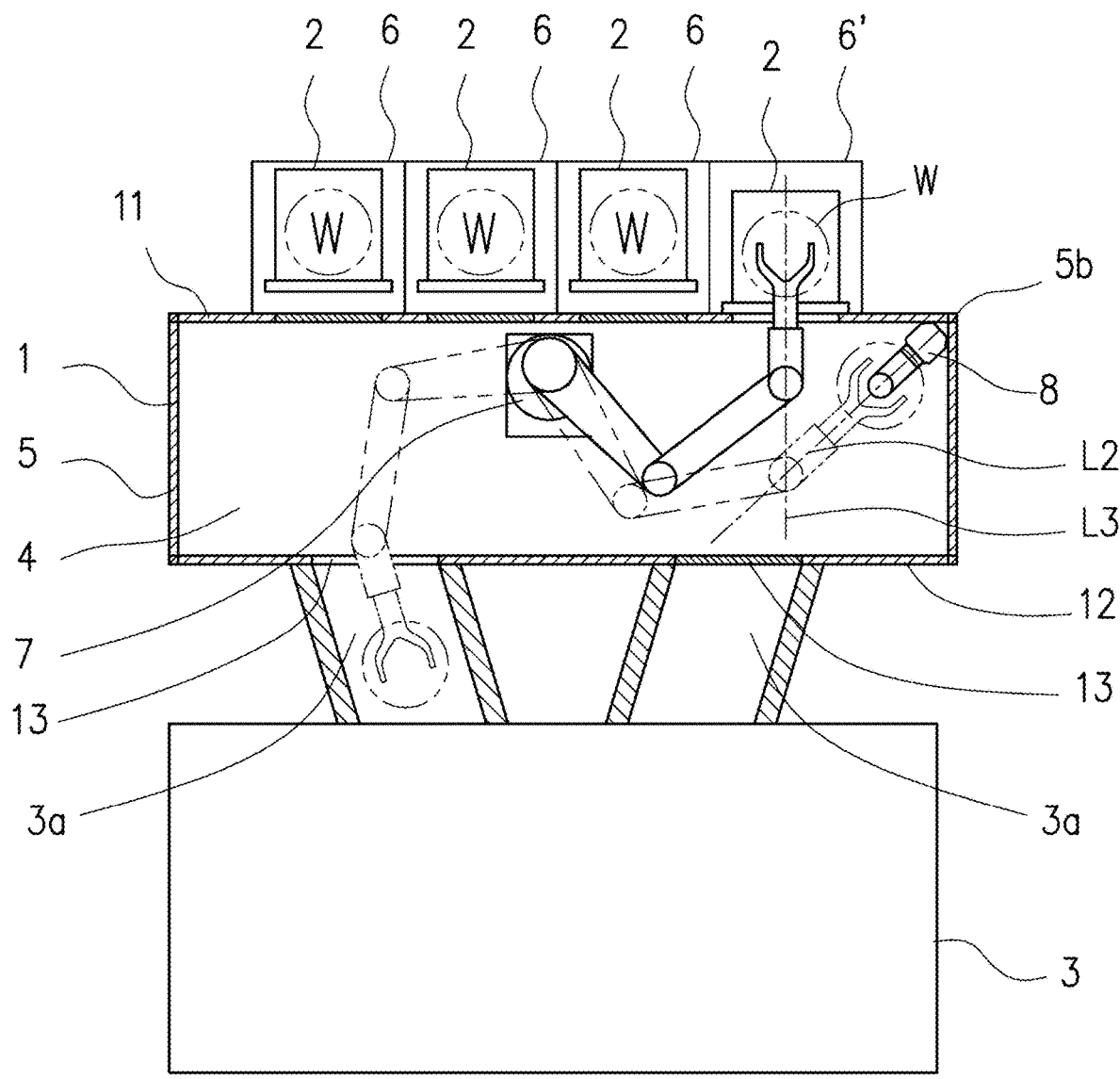
FIG. 1 is a plan view showing a configuration of a wafer transfer apparatus according to one embodiment of the invention.
Figure 2:
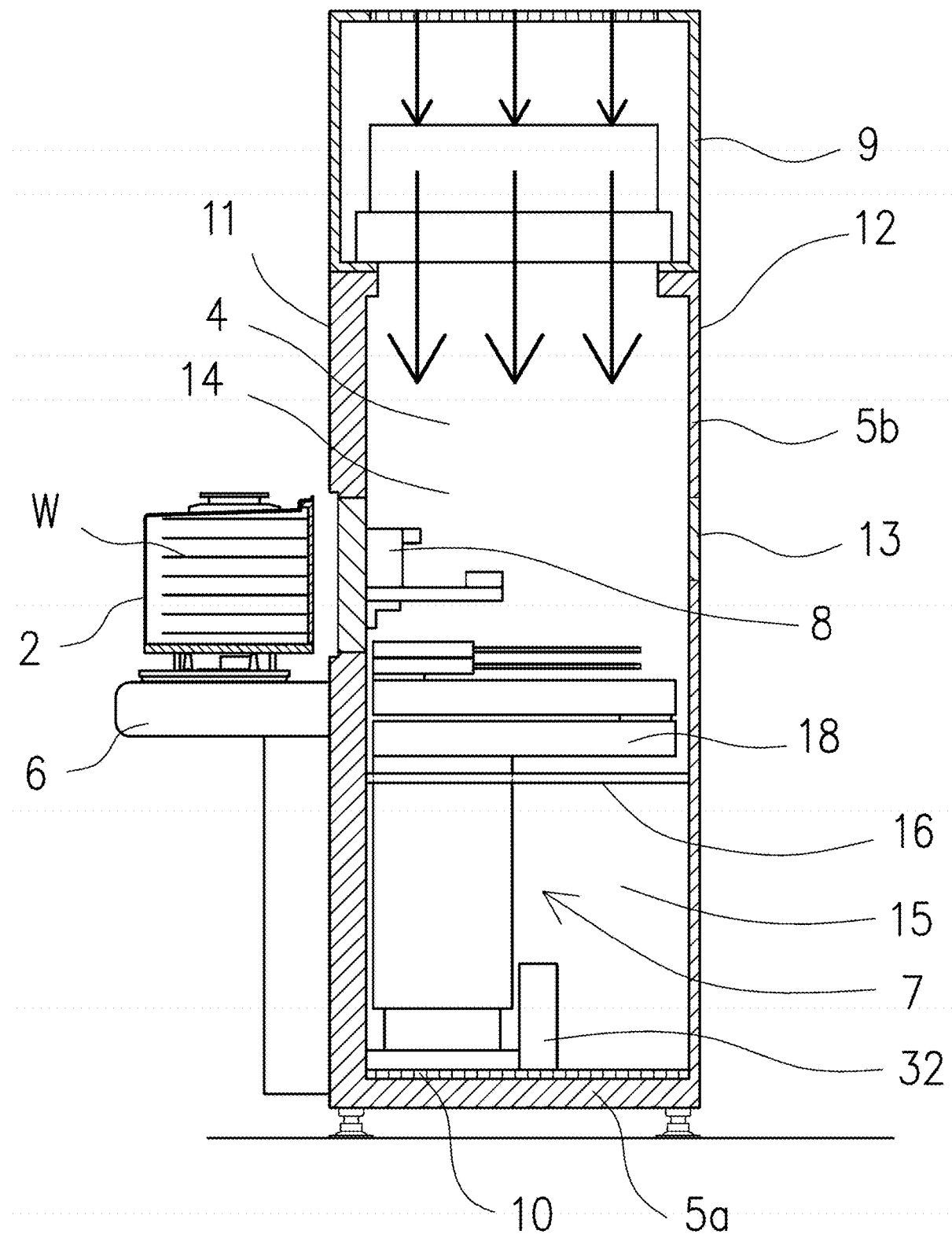
FIG. 2 is a side view showing the configuration of the wafer transfer apparatus according to one embodiment of the invention.
Figure 3:
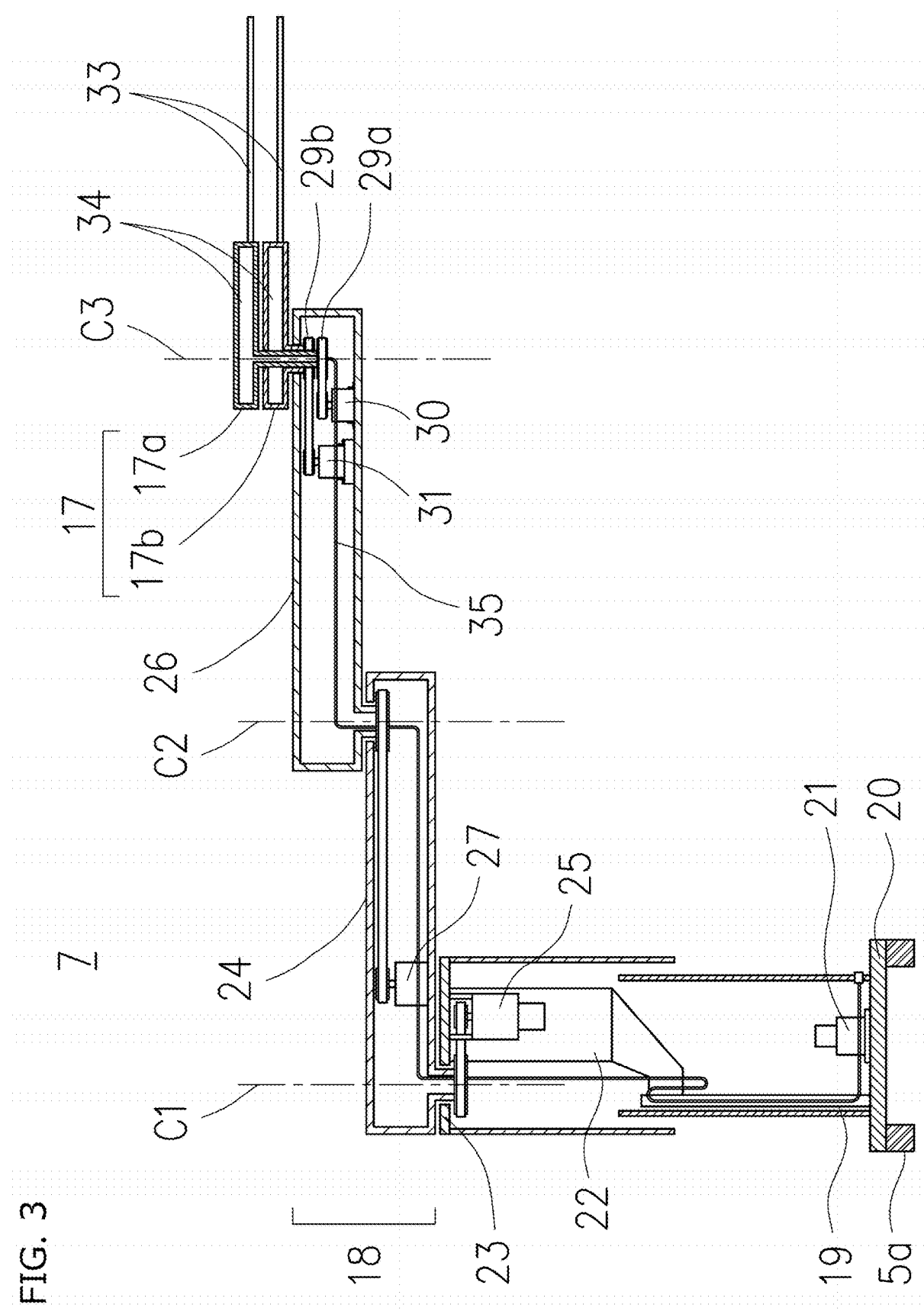
FIG. 3 is a cross-sectional view showing a wafer transfer robot according to one embodiment of the invention.

Hereinbelow, an embodiment of the invention will be described with reference to the drawings. FIG. 1 is a plan view showing a configuration of a wafer transfer apparatus 1 according to one embodiment of the invention, and FIG. 2 is a left cross-sectional side view showing a state where the wafer transfer apparatus of FIG. 1 is cut at an inner position close to a left side wall. In FIG. 2, a wafer processing apparatus 3 is omitted. In addition, FIG. 3 is a cross-sectional view showing one embodiment of a wafer transfer robot 7 provided in the wafer transfer apparatus 1 shown in FIG. 1. The wafer transfer apparatus 1 shown in FIG. 1 transfers a wafer W between a FOUP 2 and the wafer processing apparatus 3 in a transfer space 4 while maintaining a clean environment. The wafer transfer apparatus 1 includes a frame 5 forming the transfer space 4; a lid opening and closing device called a load port 6 which is fixed to the frame 5, on which the FOUP 2 accommodating the wafer W is placed, and which opens and closes a lid of the FOUP 2; the wafer transfer robot 7 disposed in the transfer space 4 to transfer the wafer W between the FOUP 2 and a substrate processing apparatus; and an aligner 8 that performs positioning of the wafer W. In addition, an FFU 9 that supplies clean air to the transfer space 4 in a laminar downflow is provided above the transfer space 4. Incidentally, a bottom plate 10 in which a predetermined opening is formed is fixed to a bottom frame 5a of the transfer space 4, and the air supplied from the FFU 9 is discharged from the transfer space 4 to the outside of the transfer space 4 through the opening of the bottom plate 10. In addition, a front wall 11 that airtightly closes the transfer space 4 and the outside is fixed to a wall surface of the transfer space 4 on which the load port 6 is disposed, and a back wall 12 is fixed to a surface of the transfer space 4 facing the front wall 11. In addition, openings 13 for delivering the wafer W between the transfer space 4 and the wafer processing apparatus 3 are formed in the back wall 12.

Further, a differential pressure plate 16 that partitions a substrate transfer area 14 requiring a high cleanliness and a low pressure area 15 therebelow off from each other is disposed in the transfer space 4 of the wafer transfer apparatus 1 of the present embodiment. The differential pressure plate 16 is a plate-shaped member disposed in a horizontal direction in the transfer space 4, and partitions the substrate transfer area 14 and the low pressure area 15 off from each other such that gas can flow therethrough. In addition, the differential pressure plate 16 is disposed below an arm body 18 provided in the wafer transfer robot 7, at a position where the differential pressure plate 16 does not come into contact with the arm body 18 even when the arm body 18 has moved to a lowest position by an elevating mechanism 19. Incidentally, the differential pressure plate 16 is made of a punching metal in which a large number of through-holes each having a predetermined diameter are provided at predetermined intervals. The substrate transfer area 14 above is maintained at a higher air pressure than the low pressure area 15 below by the differential pressure plate 16, and dust that has been generated inside the wafer transfer robot 7 and that has flowed out to the low pressure area 15 does not intrude into the substrate transfer area 14 above. In addition, since dust generated in the substrate transfer area 14 above passes through the through-holes of the punching metal and flows out to the low pressure area 15 below, the substrate transfer area 14 is maintained in a highly clean state.

The wafer transfer robot 7 of the present embodiment is a horizontal articulated SCARA robot, and includes at least a finger 17 that holds the wafer W; the arm body 18 that rotatably supports the finger 17 to move the finger 17 to a predetermined position in a horizontal plane; an arm drive mechanism that drives the arm body 18; the elevating mechanism 19 that moves up and down the arm body 18 in a vertical direction in a state where the elevating mechanism 19 rotatably supports the arm body 18; and a base 20 to which the elevating mechanism 19 is fixed.

The base 20 is fixed to the floor frame 5a forming the transfer space 4, at a position close to the back wall 12. The elevating mechanism 19 and an elevating drive motor 21 that drives the elevating mechanism 19 are attached to the base 20, and a rotary shaft (not shown) of the elevating drive motor 21 and a ball screw mechanism of the elevating mechanism 19 are connected to each other via pulleys (not shown) and via a belt (not shown). Therefore, when the elevating drive motor 21 operates, a movable body screwed with the ball screw mechanism forming the elevating mechanism 19 moves up and down. An elevating plate 23 is fixed to the movable body via a bracket 22. A proximal end portion of a first arm 24 forming the arm body 18 is attached to the elevating plate 23 via a bearing so as to be rotatable around a straight line C1 as a rotation center shown in FIG. 3. Further, a first arm drive motor 25 is attached to the elevating plate 23. A pulley fixed to a rotary shaft of the first arm drive motor 25 and a pulley coaxially fixed to the proximal end portion of the first arm 24 having the straight line C1 as a rotation center are connected to each other via a belt to form an arm drive mechanism for the first arm 24. With this configuration, when the first arm drive motor 25 operates, the first arm 24 operates to rotate with respect to the elevating plate 23.

A proximal end portion of a second arm 26 that is another arm forming the arm body 18 is attached to a distal end portion of the first arm 24 via a bearing so as to be rotatable around a straight line C2 as a rotation center extending in the vertical direction. The first arm 24 has a hollow box-shaped or tubular structure, and a second arm drive motor 27 that drives the second arm 26 is fixed inside the first arm 24. A pulley coaxially fixed to a rotary shaft of the second arm drive motor 27 and a pulley coaxially fixed to the proximal end portion of the second arm 26 having the straight line C2 as a rotation center are connected to each other via a belt. With this configuration, when the second arm drive motor 27 operates, the second arm 26 operates to rotate with respect to the first arm 24.

Proximal end portions of an upper finger 17a and of a lower finger 17b that hold the wafer W are each attached to a distal end portion of the second arm 26 via bearings so as to be individually rotatable around a common straight line C3 (hereinafter, referred to as the "rotation axis C3") as a rotation center extending in the vertical direction. The second arm 26 has a hollow box-shaped or tubular structure, and drive mechanisms (finger drive mechanisms) 29a and 29b that rotationally drive the upper and lower fingers 17a and 17b, respectively, are disposed in an internal space. The drive mechanism 29a that rotationally drives the upper finger 17a is formed of an upper finger drive motor 30 and a belt suspended between a pulley fixed to the upper finger 17a and a pulley fixed to a rotary shaft of the upper finger drive motor 30. In addition, the drive mechanism 29b that rotationally drives the lower finger 17b is formed of a lower finger drive motor 31 and a belt suspended between a pulley fixed to the lower finger 17b and a pulley fixed to a rotary shaft of the lower finger drive motor 31. The upper finger drive motor 30 and the lower finger drive motor 31 are fixed to the second arm 26. The pulleys are fixed to the respective rotary shafts of the upper finger drive motor 30 and of the lower finger drive motor 31, and the pulleys each having the rotation axis C3 as a rotation center are coaxially fixed to the proximal end portion of the upper finger 17a and to the proximal end portion of the lower finger 17b, respectively. The pulleys fixed to the upper finger 17a and to the lower finger 17b are disposed to be offset in position from each other in an up-down direction such that the pulley fixed to the lower finger 17b is located above. In addition, the pulley of the upper finger drive motor 30 and the pulley of the lower finger drive motor 31 are also disposed to be offset in position from each other in the up-down direction such that the pulley of the lower finger drive motor 31 is located above. These each pulley and these each rotation axes of the drive motors corresponding to each other are connected to each other via the respective belts to form an arm drive mechanism for the second arm. With this configuration, when the upper finger drive motor 30 operates, the upper finger 17a operates to rotate independently of the second arm 26, and when the lower finger drive motor 31 operates, the lower finger 17b operates to rotate independently of the second arm 26.

Incidentally, each motor provided in the wafer transfer robot 7 of the present embodiment may be any known motor such as a servo motor, a stepping motor, or a direct drive motor as long as a rotational angle of the motor can be controlled by a control device. In addition, it is desirable that each motor is provided with an encoder that detects a rotational angle of the corresponding rotary shaft. In addition, as each motor provided in the wafer transfer robot 7 of the present embodiment, a speed reducer-integrated geared motor in which a motor body and a speed reducer are disposed inside the same housing is used, but a configuration in which a speed reducer independent of each motor is provided may be employed. In addition, a configuration in which a speed reducer is not provided may be employed. In addition, it is preferable that the wafer transfer robot 7 of the present embodiment includes position detection sensors (not shown) that detect positions of the elevating mechanism 19, of the first arm 24, of the second arm 26, and of the upper and lower fingers 17a and 17b.

Output signals from these position detection sensors or from each encoder are transmitted to a robot control unit 32 (FIG. 8) provided in the wafer transfer robot 7. The robot control unit 32 includes a CPU that performs calculation processing; a receiver that receives a signal output from each sensor; a transmitter that transmits control signals to electric components such as the motors; and storage means for storing a program and various setting data or instruction data for operating the robot. The robot control unit 32 operates each motor based on the program stored in advance, to move the upper finger 17a and the lower finger 17b (hereinafter, the upper and lower fingers 17a and 17b may be collectively referred to simply as the "finger 17") along a desired path. In addition, the robot control unit 32 includes communication means for transmitting and receiving various signals to and from a control PC that controls the wafer transfer apparatus 1, and causes the wafer transfer robot 7 to operate according to an operation command from the control PC.

Figure 4A:
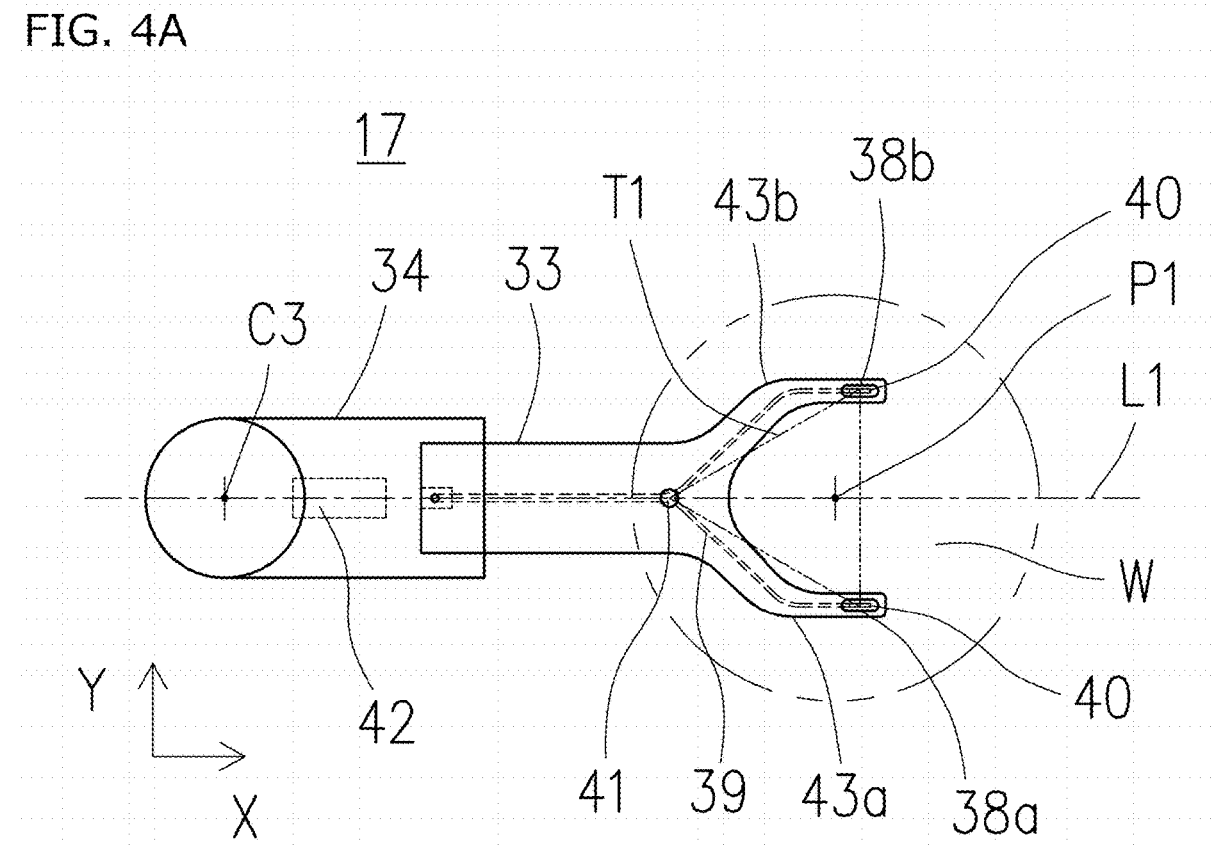
FIGS. 4A and 4B are a view showing upper and lower fingers according to one embodiment of the invention.
Figure 4B:
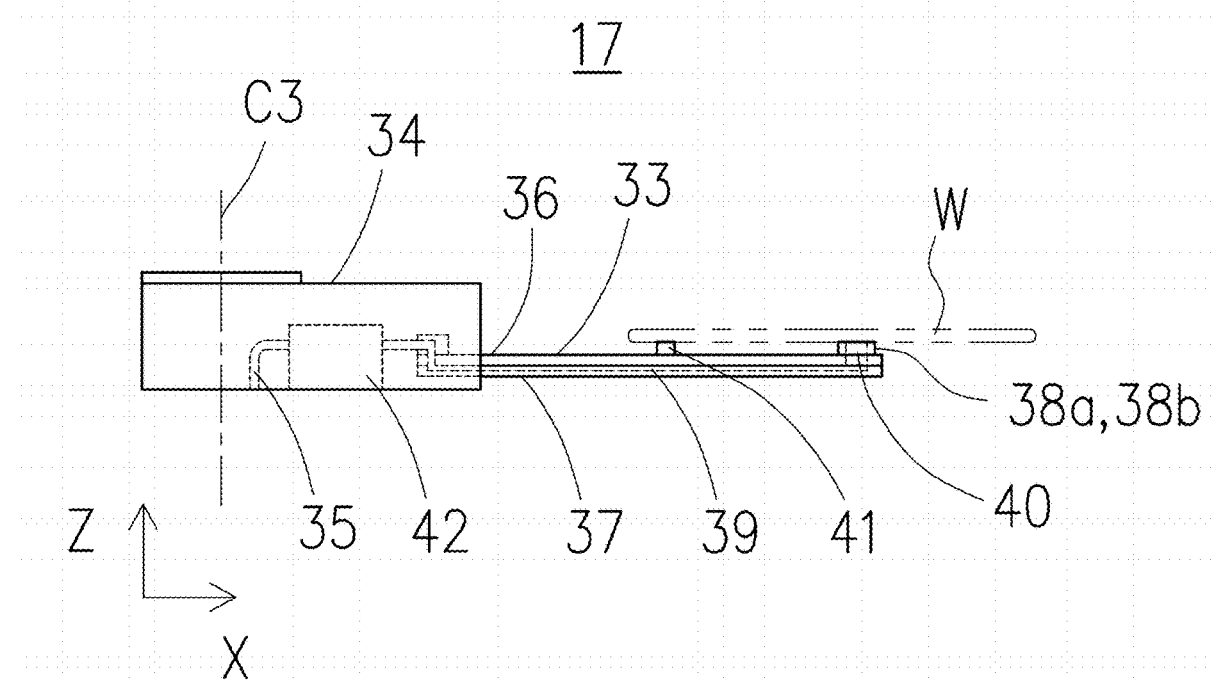

FIGS. 4A and 4B is a plan view for describing a configuration of each of the upper and lower fingers 17a and 17b of the present embodiment. Since the upper finger 17a and the lower finger 17b have the same configuration, only one finger is shown as the "finger 17" in FIGS. 4A and 4B. FIGS. 4A and 4B show positions of the finger 17 and of the wafer W held by the finger 17. The wafer W is held at a reference position (indicated by a chain double dashed line) of each of the upper and lower fingers 17a and 17b determined by design. Each of the upper finger 17a and the lower finger 17b of the present embodiment is formed of a holding portion 33 that holds the wafer W, and a wrist portion 34 that supports a proximal end of the holding portion 33. The finger 17 of the present embodiment is a wafer suction type finger that fixes the wafer W to the finger 17 by drawing vacuum from the vicinity of a distal end portion of the finger 17 in a state where the finger 17 lifts the wafer W from below. For this reason, the finger 17 is connected to a vacuum source (not shown) provided in a clean room, via a piping member 35.

In addition, in the present embodiment, an example is shown in which the holding portion 33 is configured by bonding together an upper member 36 and a lower member 37 of which each distal end portion is bifurcated and formed in a Y shape. Wafer holding pads 38a and 38b that come into contact with a lower surface of the wafer W to suction the wafer W are formed in a shape rising higher than a periphery, on the respective Y-shaped bifurcated distal end portions of the upper member 36. A recess having an oval shape is formed in a top portion of each of the wafer holding pads 38a and 38b, and a through-hole 40 communicating with a vacuum flow path 39 formed in the lower member 37 is formed in a bottom portion of the recess. Further, a wafer contact portion 41 formed with the same height as each of the wafer holding pads 38a and 38b is provided at another position on an upper surface of the upper member 36, and the wafer W is supported at three points, namely, the wafer holding pads 38a and 38b and the wafer contact portion 41. A groove having a Y shape that forms the vacuum flow path 39 is cut open in the lower member 37, and a coupling for connection to the vacuum source is connected to a proximal end portion of the groove. The piping member 35 communicating with the vacuum source is connected to the coupling of the holding portion 33 via an electromagnetic valve 42 disposed inside the wrist portion 34. The electromagnetic valve 42 is electrically connected to the robot control unit 32, and when an opening and closing signal of the electromagnetic valve 42 transmitted from the robot control unit 32 is received, the wafer transfer robot 7 can hold the wafer W on the finger 17 or release holding.

The wafer holding pads 38a and 38b are disposed on distal end portions of a pair of wafer holding rods 43a and 43b bifurcated in a Y shape, respectively. It is desirable that when viewed from above, the upper and lower fingers 17a and 17b of the present embodiment are formed to be line symmetric in a horizontal plane with respect to a straight line L1 connecting the rotation axis C3 of the upper and lower fingers 17a and 17b and a longitudinal center line of the holding portion 33. In addition, the wafer W is supported from below by abutting on the left and right wafer holding pads 38a and 38b and on the wafer contact portion 41, and vacuum drawing is applied to the left and right wafer holding pads 38a and 38b, so that the wafer W is suctioned and held. Accordingly, the wafer W is held on the upper and lower fingers 17a and 17b without being offset in position by a transfer operation of the wafer transfer robot 7. Incidentally, in order to make the upper and lower fingers 17a and 17b to be able to stably hold the wafer W, it is desirable that the wafer W is supported such that a center P1 of the wafer is located inside a triangle T1 formed by straight lines connecting the left and right wafer holding pads 38a and 38b and the wafer contact portion 41. Accordingly, even when vacuum drawing applied to the wafer holding pads 38a and 38b is interrupted, the wafer W is supported at a regular position on the upper and lower fingers 17a and 17b.

Incidentally, the upper and lower fingers 17a and 17b of the present embodiment supports the wafer W in the vertical direction by coming into contact with the wafer W at at least three points, namely, the left and right wafer holding pads 38a and 38b and the wafer contact portion 41, but the invention is not limited to this configuration. For example, the number of the wafer holding pads 38a and 38b that vacuum-suction the wafer W may be 1, and the number of the wafer contact portions 41 may be 2 or more, or the wafer contact portion 41 may be eliminated, and the number of the wafer holding pads 38a and 38b may be 3 or more. However, even in this case, it is desirable that the center P1 of the wafer W is disposed inside the triangle T1 formed by straight lines connecting the at least three support points among the holding pads 38 and the wafer contact portions 41 disposed on the upper and lower fingers 17a and 17b.

Figure 5:
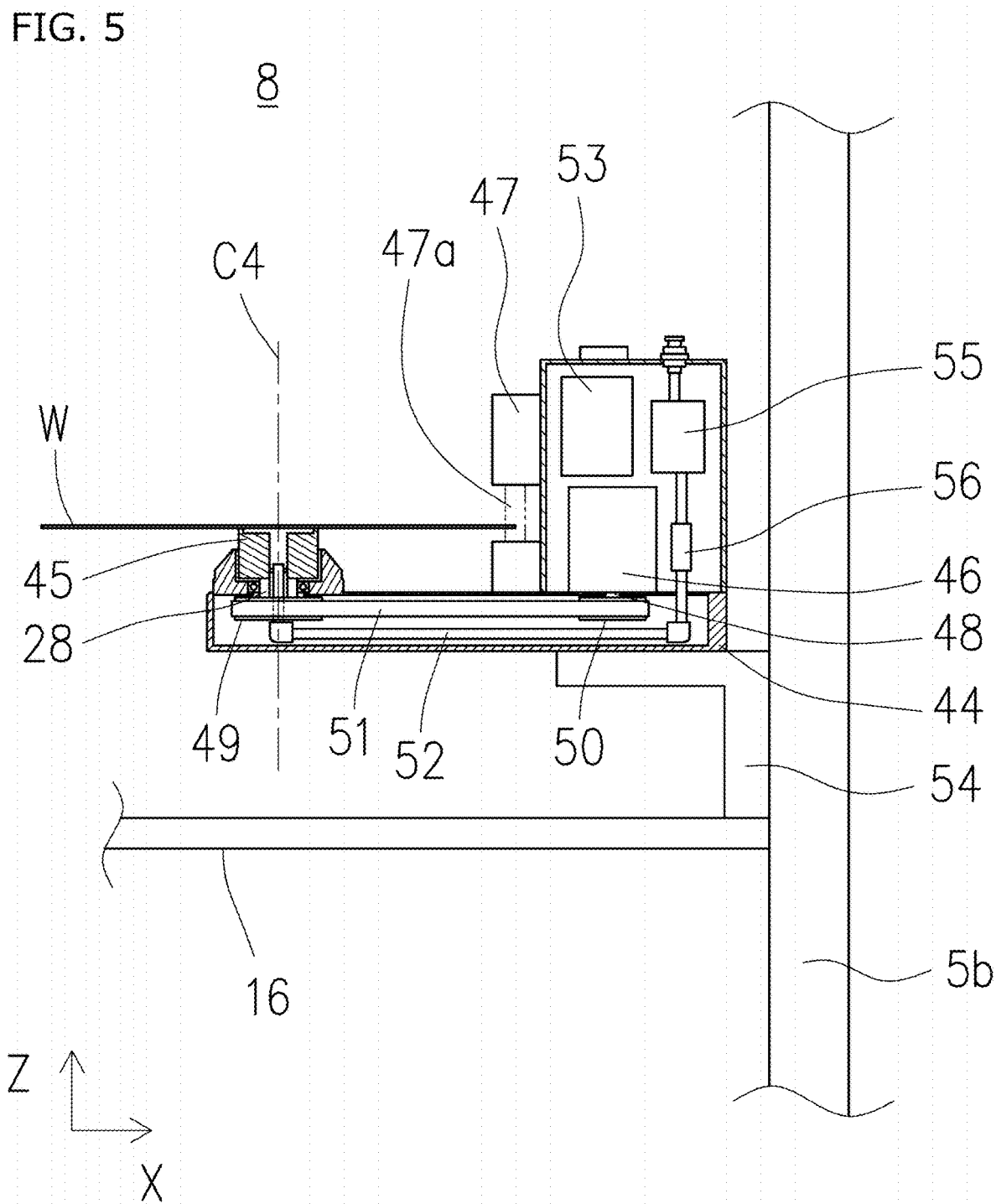
FIG. 5 is a cross-sectional view showing an aligner according to one embodiment of the invention.

Next, the aligner 8 provided in the wafer transfer apparatus 1 of the present embodiment will be described. FIG. 5 is a cross-sectional view showing an internal structure of the aligner 8 of the present embodiment in a simplified manner. The aligner 8 of the present embodiment includes a base member 44; a wafer pedestal 45 rotatably provided on the base member 44 to suction and hold the wafer W; an aligner motor 46 that rotationally drives the wafer pedestal 45 around a straight line C4 (hereinafter, referred to as the "rotation axis C4") as a rotation center via a belt 51; a wafer detection sensor 47 that detects a peripheral edge portion of the wafer W that rotates while being held on the wafer pedestal 45; and an aligner control unit 53 (refer to FIG. 8).

The wafer pedestal 45 is fixed to an upper portion of a shaft 28 having a cylindrical shape that is rotatably attached to the base member 44 via a bearing, and is configured to rotate around the rotation axis C4 as a rotation center extending in the vertical direction, together with the shaft 28. A driven pulley 49 is fixed to a lower end of the shaft 28.

The aligner motor 46 is fixed to the base member 44, and a drive pulley 50 is fixed to a distal end of a rotary shaft 48 of the aligner motor 46. The belt 51 is suspended between the drive pulley 50 and the driven pulley 49, and accordingly, when the aligner motor 46 operates to rotate, the wafer pedestal 45 rotates around the rotation axis C4 as a rotation center. Further, the rotary shaft 48 is provided with an encoder (not shown) that detects a rotational angle of the rotary shaft 48, and a detection signal of the encoder is transmitted to the aligner control unit 53. Incidentally, as the aligner motor 46 provided in the aligner 8 of the present embodiment, a speed reducer-integrated geared motor in which a body and a speed reducer are disposed inside the same housing is used, but a configuration in which a speed reducer independent of the aligner motor 46 is provided may be employed.

The wafer pedestal 45 is a cylindrical member in which a through-hole is provided in the vertical direction at a central portion, and can be molded from a resin material. A flow path for vacuum-suctioning the wafer W is formed in a surface on which the wafer W is placed, which is an upper surface of the wafer pedestal 45. A rotary coupling is connected to the shaft 28 that is fixed to a lower side of the wafer pedestal 45 and that rotates together with the wafer pedestal 45. The rotary coupling is connected to the vacuum source such as a vacuum pump (not shown) via a piping member 52. The rotary coupling is formed of a fixed portion connected to the piping member 52, and a rotary portion connected to the shaft 28, and is a member in which the fixed portion and the rotary portion are connected by a bearing and a seal such as an O-ring. The rotary coupling rotationally supports the wafer pedestal 45 and the shaft 28, and transmits a suction force from the vacuum pump to the inside of the wafer pedestal 45 while preventing a leakage of air.

An electromagnetic valve 55 is disposed in the middle of the piping member 52, and the electromagnetic valve 55 operates to apply vacuum drawing to the wafer pedestal 45 and to release vacuum pressure. A pressure sensor 56 that detects a pressure inside the piping member 52 is provided in the middle of the piping member 52 connecting the electromagnetic valve 55 and the wafer pedestal 45. The pressure sensor 56 detects a pressure inside the piping member 52 to detect whether or not the wafer W is placed on the wafer pedestal 45 and to detect whether or not the placement is normal.

Incidentally, the wafer pedestal 45 may be made of a material that is easy to process, that generates little dust, and that does not damage the wafer W, and can be manufactured using, for example, polytetrafluoroethylene. In addition, in addition to polytetrafluoroethylene, a resin material such as polyether ether ketone can also be used.

The wafer detection sensor 47 detects a notch or an orientation flat formed at the peripheral edge portion of the wafer W that rotates while being held on the wafer pedestal 45, and detects a positional offset amount between the center P1 of the wafer W and the rotation axis C4 of the wafer pedestal 45 and a positional offset direction by detecting the peripheral edge portion of the wafer W. The wafer detection sensor 47 of the present embodiment is a light transmission type sensor in which a detection unit detects detection light 47a emitted from a light projection unit. In addition, the wafer detection sensor 47 of the present embodiment is a line sensor, has a configuration in which a plurality of optical sensors (detection units) disposed on a straight line detect the detection light 47a emitted from a plurality of light projectors (light projection units) disposed on the straight line, and measures a position of a peripheral edge of the wafer W in a radial direction of the wafer W, the wafer W being held on the wafer pedestal 45. Incidentally, when viewed from above, the light projectors and the optical sensors of the wafer detection sensor 47 provided in the aligner 8 of the present embodiment are disposed to coincide with a straight line L2 passing through the rotation axis C3 of the finger 17 and through the rotation axis C4 of the wafer pedestal 45 and extending in a longitudinal direction (X direction) of the aligner 8 (refer to FIG. 6).

In addition, the aligner 8 of the present embodiment includes the aligner control unit 53, and the aligner control unit 53 and each of the aligner motor 46, the encoder, the electromagnetic valve 55, and the wafer detection sensor 47 are electrically connected to each other. The aligner control unit 53 controls rotation of the aligner motor 46, and calculates a positional offset amount or a positional offset direction of the wafer W and a position of the notch or the orientation flat by acquiring position information of the wafer and rotational angle information of the motor from electric signals from the wafer detection sensor 47 and from the encoder. In addition, the aligner control unit 53 controls the electromagnetic valve 55 to suction and hold the wafer W onto the wafer pedestal 45 and to release suctioning.

The aligner control unit 53 of the present embodiment includes a CPU that performs calculation processing; a receiver that receives a signal output from each sensor; transmitting means for transmitting an output signal to the aligner motor 46 or to the electromagnetic valve 55; and storage means for storing a program and various setting data or instruction data for operating the aligner motor 46, and the aligner control unit 53 executes positioning of the wafer W or detection of the notch or the orientation flat based on the program provided in advance. In addition, the aligner control unit 53 includes communication means for transmitting and receiving signals to and from the control PC provided in the wafer transfer apparatus 1, and the aligner control unit 53 detects a positional offset of the wafer W, detects a position of the notch or the orientation flat, or aligns the position of the wafer W in a rotational direction according to an operation command from the control PC.

The aligner 8 of the present embodiment is fixed to a frame 5*b* standing in the vertical direction, via a bracket 54. The wafer transfer robot 7 operates each motor to extract the wafer W accommodated in the FOUP 2, from the FOUP 2, and then places the wafer W on the wafer pedestal 45 and leaves the wafer pedestal. Then, when the alignment operation by the aligner 8 is completed, the wafer transfer robot 7 moves the finger 17 to a position where the positional offset of the wafer W for which alignment is completed is to be eliminated, holds the wafer W, and transfers the wafer W from the wafer pedestal 45 of the aligner 8 to a wafer delivery position of the wafer processing apparatus 3.

Figure 6:
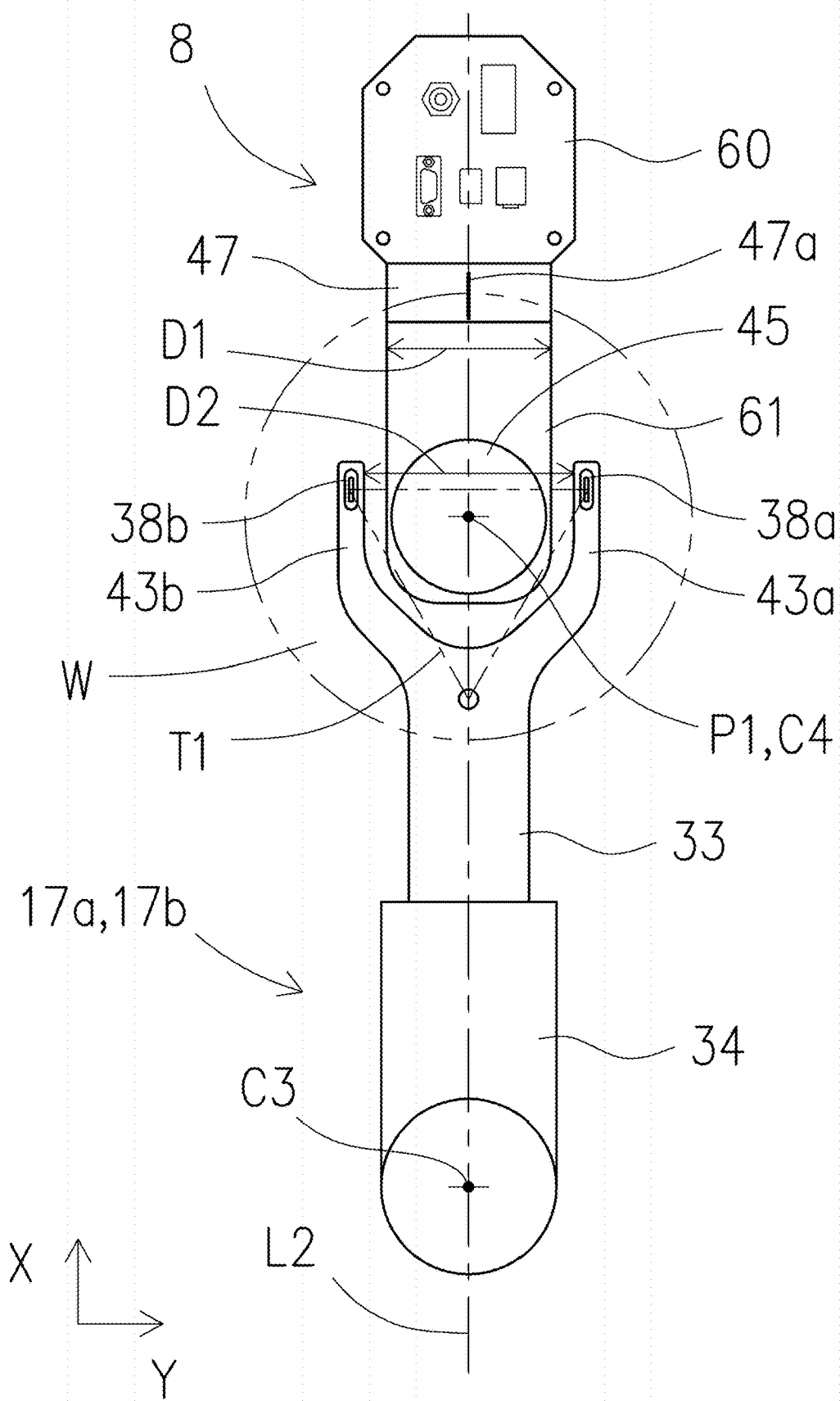
FIG. 6 is a view showing positions of the fingers and of the aligner according to one embodiment of the invention.

Next, a relationship between the fingers 17*a* and 17*b* provided in the wafer transfer robot 7 of the present embodiment and the aligner 8 will be described. FIG. 6 is a view showing a situation where the wafer transfer robot 7 of the present embodiment places the wafer W held at a "predetermined position on the fingers 17*a* and 17*b*", at a "predetermined position on the wafer pedestal 45". Incidentally, the "predetermined position on the fingers 17*a* and 17*b*" is a position determined in advance by design when the fingers 17*a* and 17*b* hold the wafer W. The wafer transfer robot 7 is instructed of the predetermined position by position instruction work performed by an installation worker prior to actual operation. Here, position information obtained by the position instruction work of the installation worker is stored in the robot control unit 32 provided in the wafer transfer robot 7.

In addition, similarly, the wafer transfer robot 7 is also instructed of the "predetermined position on the wafer pedestal 45" by position instruction work performed by the installation worker, and position information obtained by the position instruction work of the installation worker is stored in the robot control unit 32 provided in the wafer transfer robot 7. When the wafer transfer robot 7 of the present embodiment holds the wafer W, the wafer transfer robot 7 is instructed to cause the center P1 of the wafer W to be located on the center line L1 that is an axis of symmetry of the holding portion 33 formed left-right symmetrically, the axis of symmetry extending in the horizontal direction. In addition, when the wafer transfer robot 7 places the wafer W held by the holding portion 33, on the wafer pedestal 45, the wafer transfer robot 7 is instructed to cause the center P1 of the wafer W to coincide with the rotation axis C4 of the wafer pedestal 45.

Here, a width dimension D1 of a body portion 61 of the aligner 8 of the present embodiment on which the wafer pedestal 45 or the driven pulley 49 is disposed and a separation dimension D2 between the wafer holding rods 43*a* and 43*b* formed on the left and right of the distal end portion of the holding portion 33 are sized such that D1 is smaller than D2. In the aligner 8 of the present embodiment, components forming the aligner 8 are prevented from being disposed in the body portion 61 located on a periphery of an area where the wafer W is placed, to the fullest extent, and are disposed in an electric unit 60 as much as possible.

The width dimension D1 is a dimension of the body portion 61 in a direction orthogonal to the center line L2 when the upper and lower fingers 17*a* and 17*b* are postured to place the wafer W on the wafer pedestal 45 or are postured to pick up the wafer W placed on the wafer pedestal 45, and the separation dimension D2 is an interval between the wafer holding rods 43*a* and 43*b* in the direction orthogonal to the center line L2 at this time.

Incidentally, the width dimension D1 of the body portion does not need to satisfy D1<D2 in the overall width dimension of the entirety of the body portion of the aligner, and the width dimension of the body portion of the aligner in an access area of the fingers 17*a* and 17*b* may satisfy D1<D2. In addition, when the aligner 8 has a substantially rectangular shape when viewed from above as in the present embodiment, the width dimension D1 is a dimension of the substantially rectangular shape in a lateral direction (Y direction), and is a dimension of the aligner 8 in a direction in which the wafer holding rods 43*a* and 43*b* of the body portion 61 face each other, at a position interposed between the wafer holding rods 43*a* and 43*b* of the upper and lower fingers 17*a* and 17*b* when viewed from above.

Figure 7A:
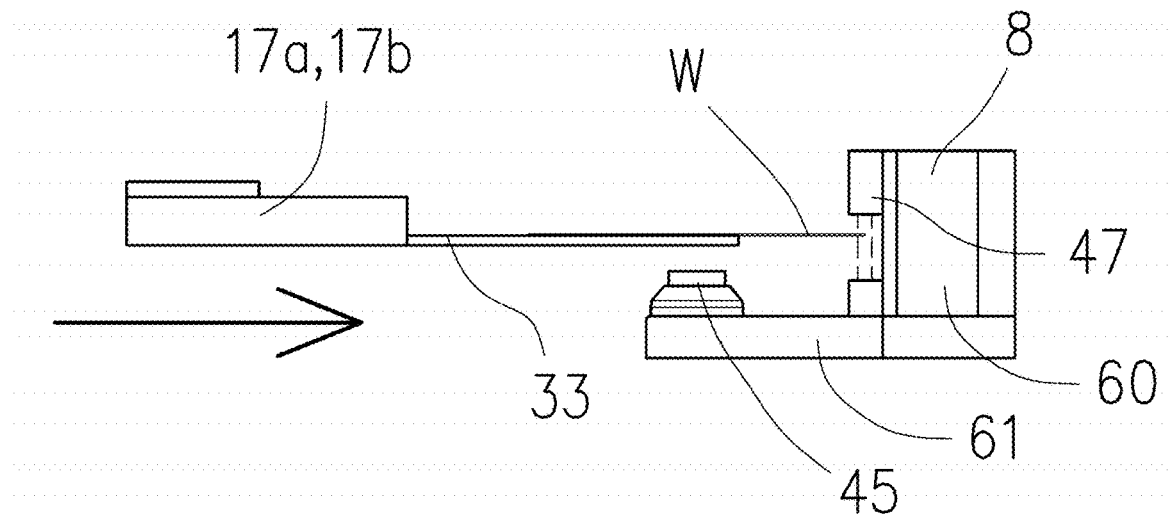
FIGS. 7A, 7B and 7C are a view showing a wafer placement operation of the wafer transfer robot according to one embodiment of the invention.
Figure 7B:
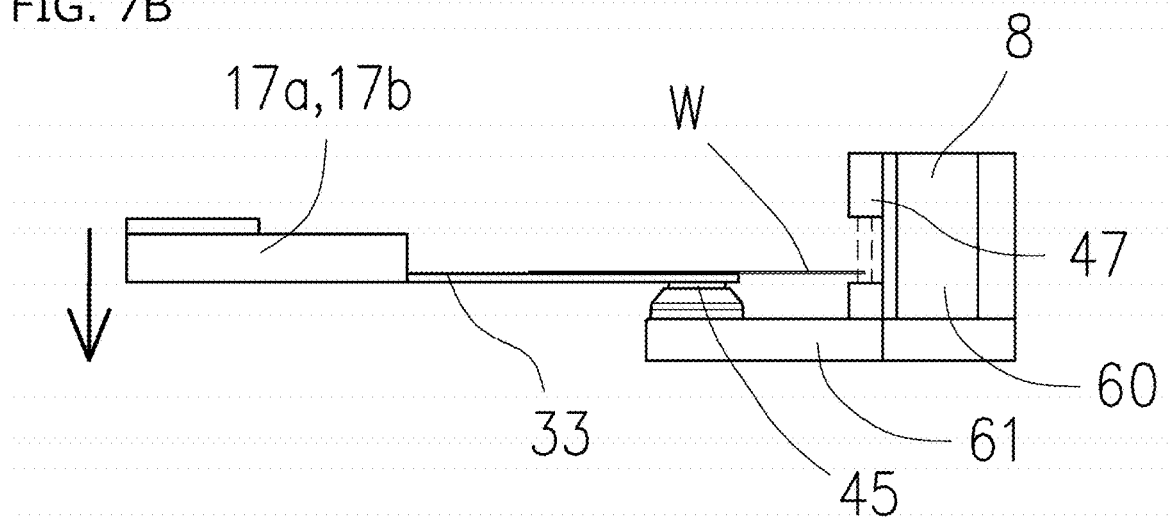
Figure 7C:
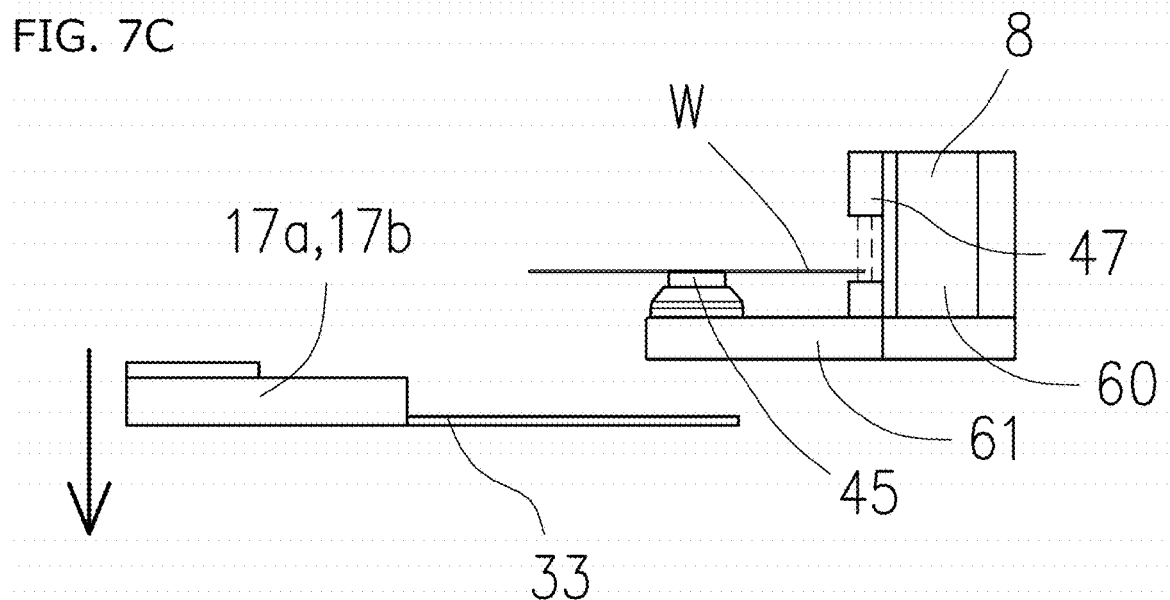

In such a manner, D1<D2 is set, so that the wafer transfer robot 7 can operate the arm body 18 to move the wafer W held on the fingers 17*a* and 17*b*, to directly above the wafer pedestal 45, and then to lower the elevating mechanism 19, to cause the fingers 17*a* and 17*b* to place the wafer W on the wafer pedestal 45, and to move the fingers 17*a* and 17*b* to below the aligner 8 in the vertical direction without stopping the elevating mechanism 19 at a placement position. Accordingly, a fine and accurate operation of the arm body is not required, and the operation can quickly transition to the next transfer operation (refer to FIGS. 7A to 7C).

In addition, when the wafer W placed on the wafer pedestal 45 is lifted, the wafer transfer robot 7 can lift the wafer W on the wafer pedestal 45 by moving the fingers 17*a* and 17b to directly below the aligner 8 and then by raising the finger 17 in the vertical direction. After the wafer W is placed on the wafer pedestal 45, a wafer transfer robot 57 of the related art retreats the fingers with respect to the aligner 8 in the horizontal direction in consideration of the risk of interference between the arm body and the wafer or the like, and then transitions to the next transfer operation. However, since the fingers 17a and 17b place the wafer W and then move to below the aligner 8 as they are, the wafer transfer robot 7 of the present embodiment can retreat the fingers 17a and 17b from the aligner 8 simply by moving down the fingers 17a and 17b through operating only the elevating mechanism 19 without operating the arm body 18. Therefore, the aligner can be operated immediately after the wafer W is placed, and the wafer transfer robot 7 can be immediately used to transfer another wafer.

In the present embodiment, an example is shown in which the single-axis aligner 8 including only drive means for rotationally moving the wafer W is provided, and position correction means for correcting a positional offset of the wafer W in the horizontal direction is not provided. In the aligner 8, for example, when the wafer transfer robot 7 receives a correction value to correct the positional offset from the aligner 8, receives the wafer W from the wafer pedestal 45 at a position instructed in advance, and then places the wafer W on a wafer stage 3a of the wafer processing apparatus 3, a positional offset of the wafer W is corrected.

The wafer transfer robot 7 can correct the positional offset of the wafer W and place the wafer W at an accurate position on the wafer stage 3a by placing the wafer W received from the wafer pedestal 45, on the wafer stage 3a after adding the correction value to position data instructed in advance. Alternatively, when the wafer transfer robot 7 holds the wafer W on the aligner 8, the wafer transfer robot 7 can correct the positional offset by moving the fingers 17a and 17b from the position instructed in advance in a direction to correct the positional offset, and thereafter by holding the wafer W on the wafer pedestal 45 with the fingers 17a and 17b.

In order to perform the latter correction operation, it is desirable that a gap ((D2−D1)/2) in a horizontal plane between the body portion 61 of the aligner 8 of the present embodiment and the wafer holding rods 43a and 43b of the fingers 17a and 17b is set to a dimension larger than an allowable positional offset amount of the wafer W accommodated in the FOUP 2 or larger than an allowable positional offset amount (maximum allowable correction amount) in the wafer processing apparatus 3. For example, when a maximum positional offset amount of the wafer W inside the FOUP 2 is n millimeters, if a dimension of each gap in a horizontal plane between both left and right side surfaces of the body portion 61 and the wafer holding rods 43a and 43b is a dimension larger than the n millimeters, even though the wafer transfer robot 7 moves the finger 17 in the direction to correct the positional offset of the wafer W, the wafer holding rods 43a and 43b and the body portion 61 do not come into contact with each other.

In addition, the aligner 8 of the present embodiment detects a rotational position offset of the notch formed in the wafer W and a positional offset amount of the wafer W in an X-Y direction with the wafer detection sensor 47, and calculates a positional offset amount of the wafer W in the X-Y direction when the notch has moved to a predetermined rotational position instructed in advance, and correction data to correct the positional offset in the X-Y direction. Next, the aligner 8 rotates the wafer W such that the notch is located at the predetermined rotational position instructed in advance on the peripheral edge of the wafer W. Then, the wafer transfer robot 7 that has received the correction data to correct the positional offset amount of the wafer W corrects the position of the wafer W in the rotational direction and the positional offset in an X-Y plane by correctively moving the finger 17 to a position where the positional offset is to be canceled, and then by lifting the wafer W on the wafer pedestal 45.

In the aligner 8 of the present embodiment, when the wafer transfer robot 7 places the wafer W on the wafer pedestal 45, the wafer transfer robot 7 moves the finger 17 to a position which is above the wafer pedestal 45 and at which the center of the wafer W coincides with the rotation axis C4 of the wafer pedestal 45 extending in the vertical direction, and then operates the elevating mechanism 19 to place the wafer W on the wafer pedestal 45. Here, when there is no offset in the holding position of the wafer, the center P1 of the wafer and the rotation axis C4 of the wafer pedestal 45 coincide with each other, and further, the fingers 17a and 17b are left-right symmetric in a horizontal plane with respect to the straight line L1 connecting the rotation axis C3 and the center P1 of the wafer. In addition, when viewed from above, the center P1 of the wafer is configured to be located inside the triangle T1 surrounded by the straight lines connecting two wafer holding pads 38a and 38b and the wafer contact portion 41 formed on the fingers 17a and 17b.

Incidentally, when the aligner 8 operates, there is a possibility that dust is generated from the motor 46, the belt 51, the bearings, or the like disposed inside and is released to the outside of the aligner 8. There is a possibility that the released dust flows to an area below the aligner 8 due to a downflow in the transfer space 4, the dust that has flowed to the area therebelow adheres to the finger 17 that has moved to below the aligner 8, and the dust that has adhered to the finger 17 moves to the wafer W when the wafer W is held. In order to avoid such a trouble, the aligner 8 of the present embodiment may be configured to include means for maintaining an internal space of the electric unit 60 or the body portion 61 of the aligner 8 at a negative pressure with respect to the transfer space 4.

It is preferable that as the means for maintaining the internal space at a negative pressure, discharge means such as a fan or a pump that suctions gas inside the aligner 8 to discharge the gas to the outside of the aligner 8 is provided. Since the inside of the electric unit 60 or the body portion 61 is set to a negative pressure, dust generated from the motor 46, the belt 51, or the like is not released from the electric unit 60 or from the body portion 61. Incidentally, since a configuration is employed in which the gas discharged from the inside of the electric unit 60 or the body portion 61 by the fan or the pump is discharged to the low pressure area 15 disposed below the substrate transfer area 14, via a duct or the like, dust does not adhere to the wafer W.

In the aligner 8 of the present embodiment, the aligner motor 46 that rotates the wafer pedestal 45, the aligner control unit 53, or the like is accommodated in the electric unit 60, but the invention is not limited to this configuration. For example, even when the electric unit 60 is configured to be disposed below the body portion 61, similarly to a first embodiment, it is quite possible for the fingers 17a and 17b to move to below the aligner 8 in the vertical direction after placing the wafer W on the wafer pedestal 45.

Further, it is quite possible to dispose the electric unit 60 above an area in which the wafer W is placed, or to dispose the electric unit 60 separately from the body portion 61. In other words, when the wafer transfer robot 7 performs delivery of the wafer W between the wafer transfer robot 7 and the aligner 8, and when the wafer transfer robot 7 moves the fingers 17a and 17b to the position instructed in advance, if the separation dimension D2 between the pair of wafer holding rods 43a and 43b is set to be larger than the width dimension D1 of the body portion 61 of the aligner 8 through which the fingers 17a and 17b pass in the vertical direction, the fingers 17a and 17b do not come into contact with the aligner 8 when being lowered. Further, instead of a method in which the elevating mechanism 19 of the wafer transfer robot 7 is operated to move up and down the fingers 17a and 17b, a configuration may be employed in which an elevating mechanism that moves up and down the aligner 8 is provided and the aligner 8 is moved up and down with respect to the fingers 17a and 17b.

Figure 8:
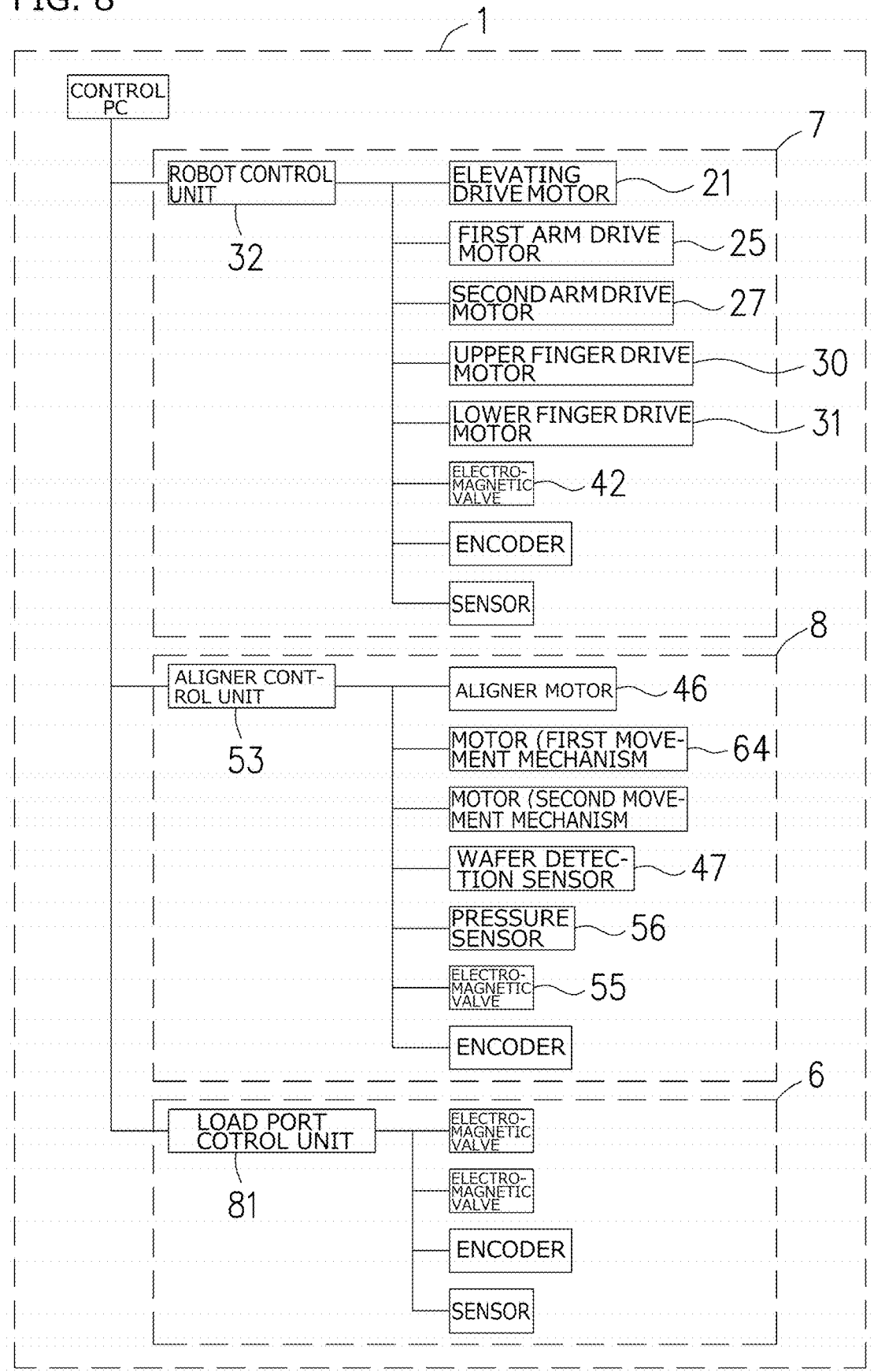
FIG. 8 is a block diagram schematically showing a configuration of a control system of the wafer transfer apparatus according to one embodiment of the invention.

Control of the wafer transfer apparatus 1 of the present embodiment is performed by the control PC and drive control units that individually control the robot 7, the aligner 8, the load port 6, and the like under control of the control PC. FIG. 8 shows a block diagram schematically showing a configuration of a control system thereof. The wafer transfer robot 7, the aligner 8, and the load port 6 provided in the wafer transfer apparatus 1 include the respective drive control units (the robot control unit 32, the aligner control unit 53, and a load port control unit 81) that receive detection signals from the detection means provided therein and that controls each drive means according to the program stored in advance. In addition, the wafer transfer apparatus 1 includes the control PC, and the control PC communicates with each of the drive control units 32, 53, and 81, and controls operation of each of the drive control units 32, 53, and 81. The control PC includes at least a CPU that performs calculations; communication means for communicating with each control unit; and storage means for storing an operation program or various data.

Next, a difference in a transfer operation of wafers W1 and W2 on the aligner 8 using the arm body 18 between the wafer transfer robot 7 provided in the wafer transfer apparatus 1 of the invention and the wafer transfer robot 57 of the related art will be described. FIGS. 9A, 9B, 9C, 9D, 9E, 9F, 9G, 9H and 9I are a view showing a transfer operation performed by the wafer transfer robot 57 of the related art, and FIGS. 10A, 10B, 10C and 10D and FIGS. 11E, 11F, 11G and 11H are views showing a transfer operation performed by the wafer transfer robot 7 of one embodiment of the invention. In the wafer transfer robot of the related art, the setting of the separation dimension D2 in a left-right direction between the pair of wafer holding rods 43a and 43b of each of upper and lower fingers 77a and 77b provided in the wafer transfer robot 57, to be larger than the width dimension D1 of a body portion of an aligner 58 is not taken into consideration, and the following operations are usually performed.

First, a first wafer W1 is extracted from the FOUP 2 placed on the load port 6, and is placed on the wafer pedestal 45 of the aligner 8 or 58 by the upper fingers 17a, 77a. Thereafter, while the aligner 8 or 58 performs positioning, a second wafer W2 is extracted and held by the lower fingers 17b, 77b and is in standby, after the positioning operation of the wafer W1 is completed, the wafer W1 on the wafer pedestal 45 is extracted by the upper fingers 17a, 77a, and the second wafer W2 held by the lower fingers 17b, 77b is placed on the wafer pedestal 45. Incidentally, these operations are performed according to the operation program stored in the robot control unit 32 in advance.

Figure 9A:
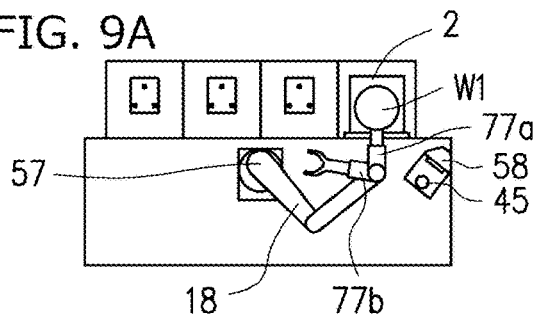
FIGS. 9A, 9B, 9C, 9D, 9E, 9F, 9G, 9H and 9I are a view showing a transfer operation performed by a wafer transfer robot in the related art.

The operation of the wafer transfer robot 57 of the related art will be described with reference to FIGS. 9A, 9B, 9C, 9D, 9E, 9F, 9G, 9H and 9I. First, after the upper finger 77a is moved to a preparation position directly facing the FOUP 2, the first wafer W1 accommodated in the FOUP 2 is held by the upper finger 77a (FIG. 9A). At this time, the wafer transfer robot 57 rotates the lower finger 77b to a retreated position where the lower finger 77b does not interfere with the operation of the upper finger 77a. Next, the wafer transfer robot 57 operates the arm body 18 and the finger 77a to extract the wafer W1 from the FOUP 2 and to move the wafer W1 to a predetermined position instructed in advance that is above the aligner 58 of the related art. Thereafter, the wafer transfer robot 57 performs a lowering operation of the elevating mechanism 19 to place the wafer W1 held by the upper finger 77a, on the wafer pedestal 45 of the aligner 58 (FIG. 9B).

Figure 9F:
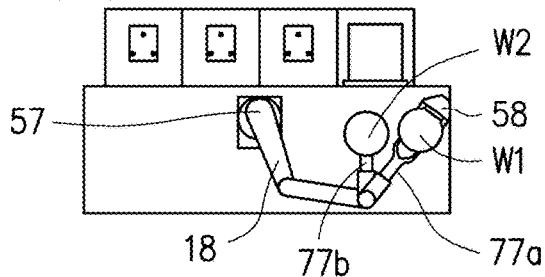
Figure 9B:
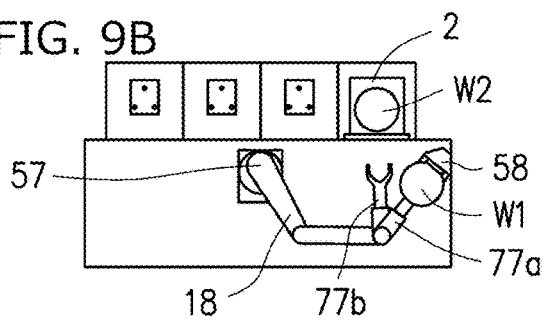
Figure 9G:
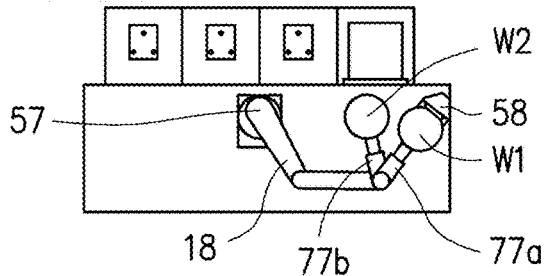
Figure 9C:
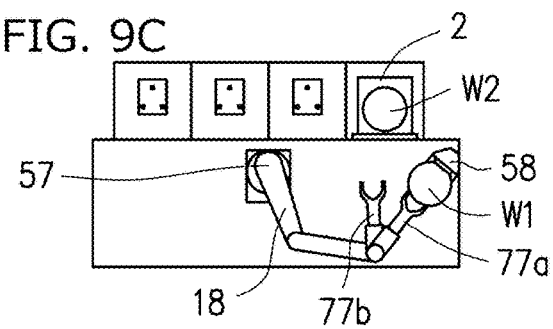

When the aligner 58 of the related art suctions and holds the wafer W1 and starts an alignment operation, the wafer transfer robot 57 operates the arm body 18 and the upper finger 77a so as not to come into contact with the wafer pedestal 45 of or with the body portion of the aligner 58, and moves the upper finger 77a to retreat in the horizontal direction with respect to the aligner 58 (FIG. 9C). At this time, a height position of the upper finger 77a in the up-down direction is below the wafer W1, and is located above the body portion of the aligner 58. Next, the wafer transfer robot 57 rotates the lower finger 77b at the retreated position, to the preparation position directly facing the FOUP 2, and then operates each drive unit to cause the lower finger 77b to hold the second wafer W2 accommodated in the FOUP 2 (FIG. 9D). At this time, the wafer transfer robot 57 rotates the upper finger 77a to the retreated position where the upper finger 77a does not interfere with the operation of the lower finger 77b. Next, the wafer transfer robot 57 operates the arm body 18 to retreat the lower finger 77b with respect to the FOUP 2, and to extract the wafer W2 (FIG. 9E).

Next, the wafer transfer robot 57 rotates the upper finger 77a at the retreated position in a direction in which the upper finger 77a directly faces the aligner 58, and rotates the lower finger 77b holding the wafer W2, to the retreated position (FIG. 9F). When the operation of the aligner 58 is completed, the wafer transfer robot 57 operates the arm body 18 to move the upper finger 77a forward to a predetermined position directly below the first wafer W1 (FIG. 9G). At the time of the forward movement, a height position of the upper finger 77a in the up-down direction is below the wafer W1, and is located above the body portion of the aligner 58. Thereafter, the wafer transfer robot 57 raises the elevating mechanism 19 to cause the upper finger 77a to lift and hold the first wafer W1 for which alignment is completed. Thereafter, the lower finger 77b is rotated to a position instructed in advance that is above the wafer pedestal 45, and the upper finger 77a is moved to the retreated position where the upper finger 77a does not interfere with the lower finger 77b.

Figure 9H:
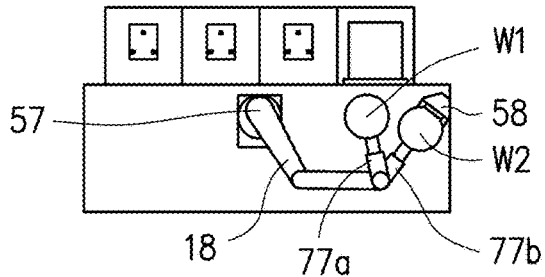
Figure 9D:
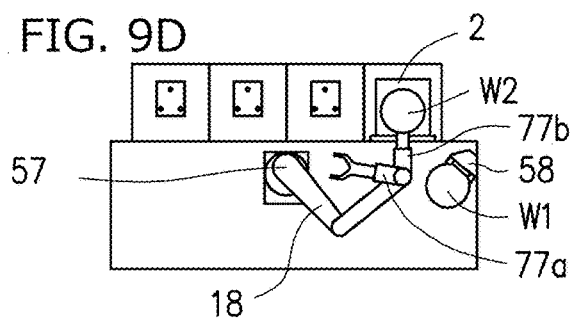
Figure 9I:
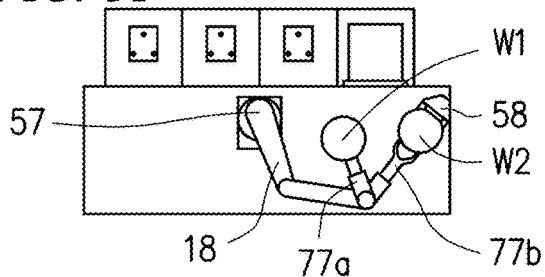
Figure 9E:
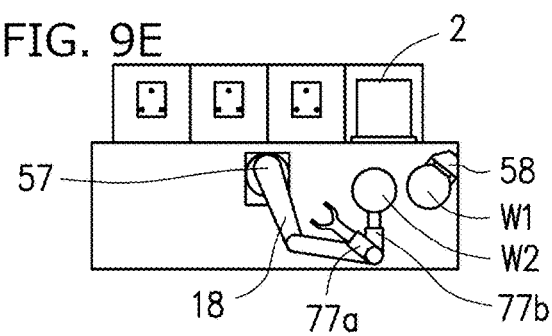

Then, the wafer transfer robot 57 operates the elevating mechanism 19 to place the wafer W2 held by the lower finger 77b, on the wafer pedestal 45 (FIG. 9H). Thereafter, the wafer transfer robot 57 retreats the lower finger 77b in a horizontal plane with respect to the aligner 58, and then transfers the wafer W1 held on the upper finger 77a of the wafer transfer robot 57, to the predetermined wafer processing apparatus 3. As described above, in the case of the wafer transfer robot 57 and the aligner 58 of the related art, when the wafer W1 or W2 is held on the aligner 58, each of the upper and lower fingers 77a and 77b cannot retreat from the aligner 58 unless retreating through between the wafer W1 or W2 and the aligner 59. At the time of this operation, since the wafer transfer robot 57 needs to move the upper and lower fingers 77*a* and 77*b* so as not to come into contact with the wafer pedestal 45, the operations of the arm body 18 and of the upper and lower fingers 77*a* and 77*b* are precise and complicated.

Figure 10A:
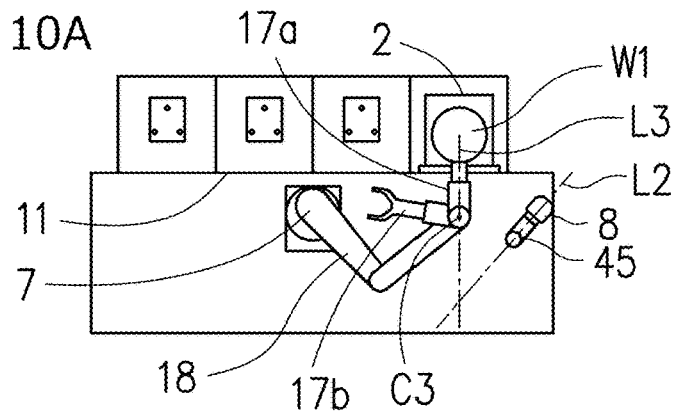
FIGS. 10A, 10B, 10C and 10D are a view showing a transfer operation performed by the wafer transfer robot according to one embodiment of the invention.

Next, the transfer operation of the wafer transfer robot 7 of the present embodiment will be described. Similarly to the wafer transfer robot 57 of the related art, the wafer transfer robot 7 rotates the upper finger 17*a* to a preparation position directly facing the FOUP 2, and then causes the upper finger 17*a* to hold the first wafer W1 accommodated in the FOUP 2 (FIG. 10A). At this time, the wafer transfer robot 7 rotates the lower finger 17*b* to a retreated position where the lower finger 17*b* does not interfere with the operation of the upper finger 17*a*. Next, the wafer transfer robot 7 operates the arm body 18 and the finger 17*a* to move the wafer W1 to a predetermined position instructed in advance that is above the wafer pedestal 45 of the aligner 8. At this time, as shown in FIGS. 10A, 10B, 10C and 10D, in a case where a wafer to be extracted next is the next wafer W2 from the FOUP 2 placed on a load port 6' closest to the aligner 8, it is desirable that as will be described below, the wafer transfer robot 7 rotates the lower finger 17*b* to a preparation position directly facing the FOUP 2.

Figure 16:
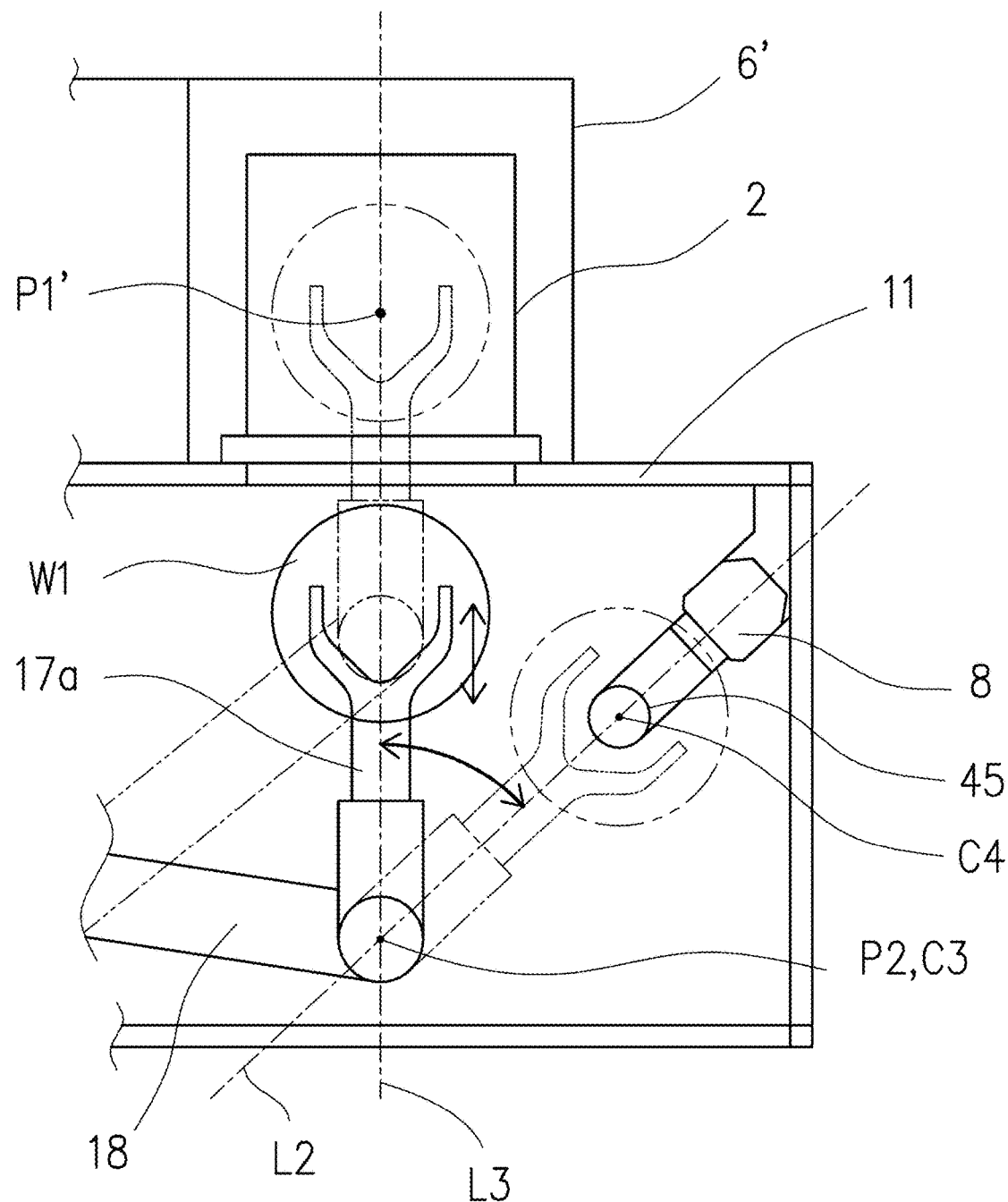
FIG. 16 is a view showing a transfer operation performed by the wafer transfer robot according to one embodiment of the invention.

Here, referring to FIG. 16, in the wafer transfer apparatus of the invention, movements of the fingers 17*a* and 17*b* that extract the wafer W1 from the load port 6' (in the present embodiment, a load port at a rightmost end) closest to the aligner 8 to move the wafer W1 to the instructed position above the aligner 8, and operation control of the wafer transfer robot 7 will be described. Incidentally, the lower finger 17*b* also extracts the wafer W2 from the load port in the same movement as the upper finger 17*a* which will be described in the next paragraph.

When the wafer transfer robot 7 puts the finger 17*a* into and out of the FOUP 2, the wafer transfer robot 7 is instructed to move the finger 17*a* forward from the position directly facing the FOUP 2, in a direction orthogonal to a direction in which the front wall 11 extends. Here, when the wafer transfer robot 7 has moved the finger 17*a* into the FOUP 2, it is preferable that a straight line L3 in a horizontal plane connecting a center P1' of the wafer W1 correctly accommodated in the FOUP 2 and the rotation axis C3 of the finger 17*a* is a straight line perpendicular to the direction in which the front wall 11 extends. Next, the wafer transfer robot 7 causes the finger 17*a* to lift the wafer W1 inside the FOUP 2 and operates the arm body 18 to move the finger 17*a* until the rotation axis C3 of the finger 17*a* is located at an intersection point P2 between the straight line L3 and the straight line L2 shown in FIG. 16 passing through the rotation axis C4 of the wafer pedestal 45. Thereafter, the wafer transfer robot 7 operates the upper finger drive motor 30 in a state where the arm body 18 is stopped, to rotationally move the upper finger 17*a* holding the wafer W1, to the predetermined position above the wafer pedestal 45.

Figure 10B:
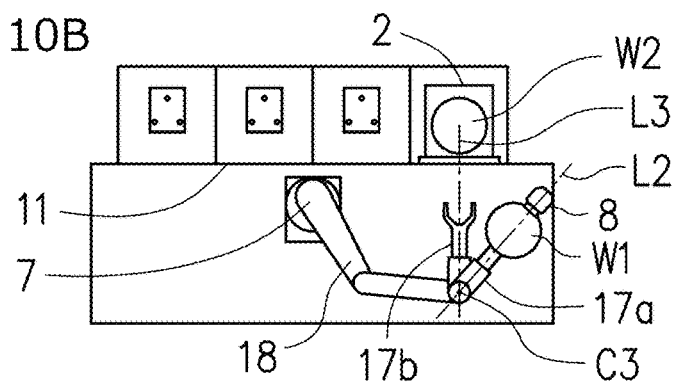

Returning to FIGS. 10A, 10B, 10C and 10D, description will be made. When the wafer W1 is moved to above the pedestal of the aligner 8, the wafer transfer robot 7 performs a lowering operation of the elevating mechanism 19 to place the wafer W1 held by the upper finger 17*a*, on the wafer pedestal 45 of the aligner 8 (FIG. 10B). Even after the elevating mechanism 19 is operated to place the first wafer W1 on the wafer pedestal 45, the wafer transfer robot 7 continues the lowering operation of the elevating mechanism 19 as it is, to move the upper finger 17*a* to a position which is below the aligner 8 and at which the upper finger 17*a* does not come into contact with the aligner 8 even when the upper finger 17*a* rotationally operates.

Figure 10C:
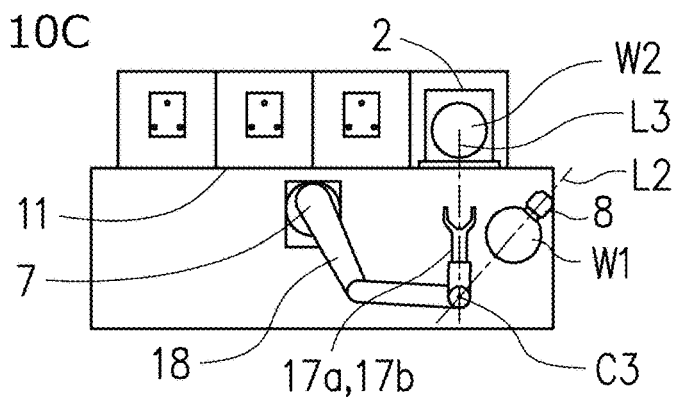
Figure 10D:
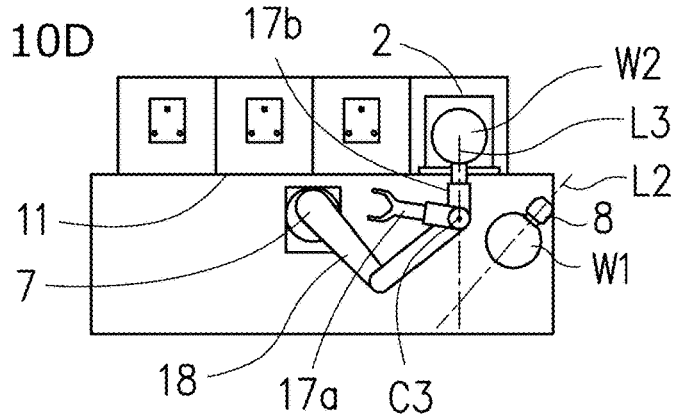

After the upper finger 17*a* has moved down to a predetermined position below the aligner 8, the wafer transfer robot 7 rotates the upper finger 17*a* around the rotation axis C3 as a rotation center to the preparation position where the upper finger 17*a* coincides with the lower finger 17*b* when viewed from above, or to at least a position where the upper finger 17*a* does not interfere with the wafer W1 even when the upper finger 17*a* is raised (FIG. 10C). Next, the wafer transfer robot 7 operates the arm body 18 and the elevating mechanism 19 to move the lower finger 17*b* to a predetermined position below the second wafer W2 accommodated in the FOUP 2, and operates the elevating mechanism 19 to cause the lower finger 17*b* to hold the second wafer W2 (FIG. 10D). At this time, the upper finger 17*a* is rotated around the rotation axis C3 as a rotation center to the retreated position where the upper finger 17*a* does not interfere with the operation of the lower finger 17*b*.

Figure 11E:
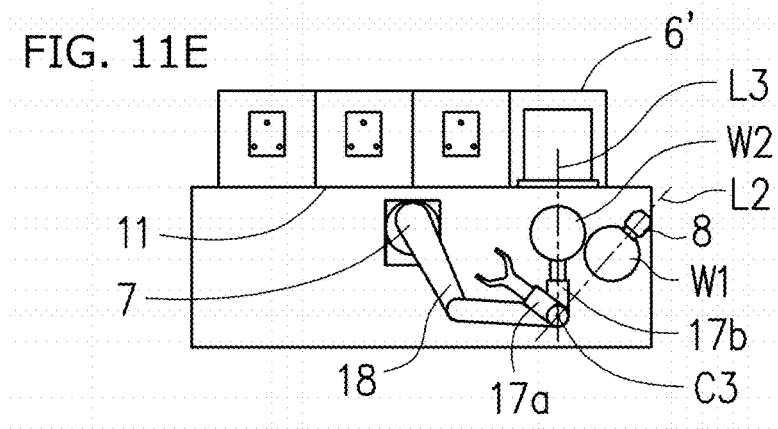
FIGS. 11E, 11F, 11G and 11H are a view showing a transfer operation performed by the wafer transfer robot according to one embodiment of the invention.
Figure 11F:
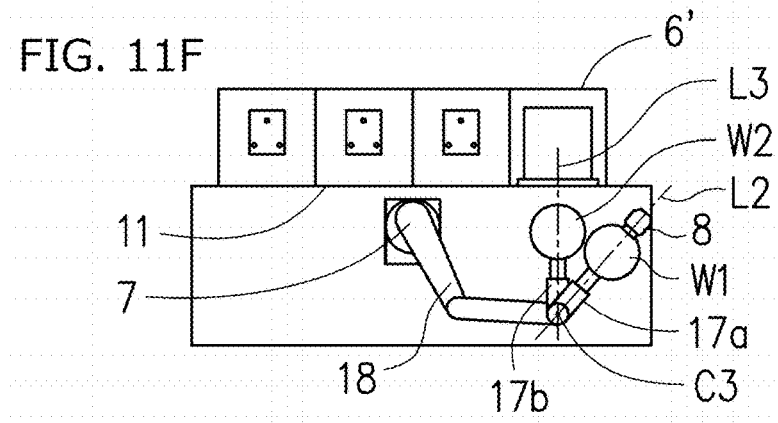

Next, the wafer transfer robot 7 operates the arm body 18 to move the lower finger 17*b* holding the wafer W2, to retreat to the preparation position (FIG. 11E). Then, the wafer transfer robot 7 operates the elevating mechanism 19 to perform a lowering operation of the upper finger 17*a* until the upper finger 17*a* is located below the aligner 8, and then rotates the upper finger 17*a* around the rotation axis C3 as a rotation center to a position instructed in advance at which the wafer W1 is held. When the operation of the aligner 8 is completed, further, the wafer transfer robot 7 moves the upper finger 17*a* to a correction position where a positional offset of the wafer W1 detected by the aligner 8 is to be canceled, and then operates the elevating mechanism 19 to raise the upper finger 17*a* to a predetermined height position above the wafer pedestal 45, and to cause the upper finger 17*a* to hold the wafer W1 for which alignment is completed (FIG. 11F). Incidentally, since the finger 17*b* holding the second wafer W2 is at the retreated position where the finger 17*b* does not interfere with the aligner 8, the rising movement of the upper finger 17*a* does not cause the wafer W2 to collide with the aligner 8.

Figure 11G:
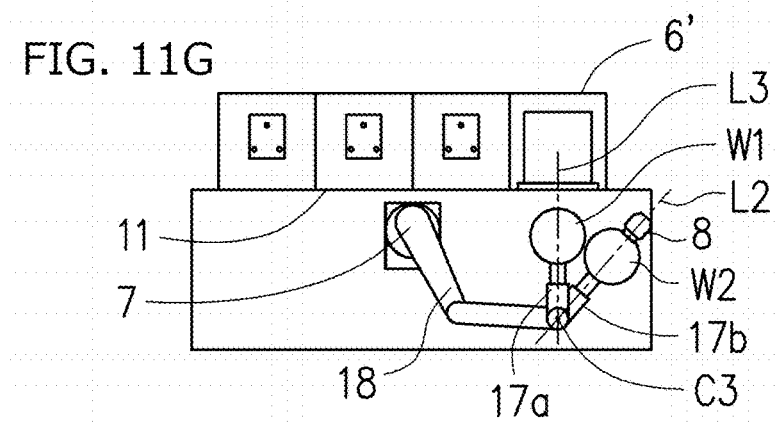
Figure 11H:
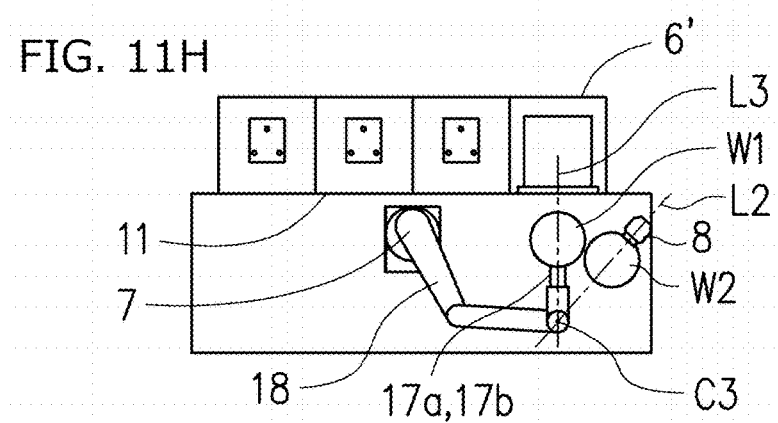

Then, the wafer transfer robot 7 moves the lower finger 17*b* to a position instructed in advance that is above the wafer pedestal 45, and rotates the upper finger 17*a* to the retreated position where the upper finger 17*a* does not interfere with the lower finger 17*b* and with the aligner 8. Thereafter, the elevating mechanism 19 is operated to place the wafer W2 held on the lower finger 17*b*, on the wafer pedestal 45. After the elevating mechanism 19 is operated to place the second wafer W2 on the wafer pedestal 45, the wafer transfer robot 7 continues the lowering operation of the elevating mechanism 19 as it is, to move the lower finger 17*b* to a predetermined position which is below the aligner 8 and at which the lower finger 17*b* does not come into contact with the aligner 8 even when the lower finger 17*b* rotationally operates (FIG. 11G). Then, the wafer transfer robot 7 rotates the lower finger 17*b* around the rotation axis C3 as a rotation center to a position where the lower finger 17*b* coincides with the upper finger 17*a* when viewed from above (FIG. 11H). Further, the wafer transfer robot 7 operates the arm body 18 and the elevating mechanism 19 to transfer the wafer W1 held on the upper finger 17*a*, to the predetermined wafer processing apparatus 3.

As described above, the wafer transfer robot 57 of the related art and the wafer transfer robot 7 of the invention differ in the operation of retreating the fingers 17*a*, 17*b*, 77*a*, and 77*b* that is performed after the wafer W1 or W2 is placed on the wafer pedestal 45. Since the wafer transfer robot 57 needs to move the fingers 77a and 77b to retreat in the horizontal direction with respect to the aligner 58, the longer the length of each arm forming the arm body 18 is, the longer the time taken for the arm body 18 to be operated to retreat the fingers 77a and 77b in the horizontal direction is. Particularly, when the length of each of the arms 24 and 26 forming the arm body 18 is a length close to a separation distance between the front wall 11 and the back wall 12, an operation range of each of the arms 24 and 26 is limited to operate each of the arms 24 and 26 so as not to come into contact with the front wall 11 or with the back wall 12.

For this reason, the operation of each of the arm bodies 24 and 26 is limited, and it takes a long time for the operation. In addition, in order to prevent the fingers 77a and 77b from coming into contact with the wafer pedestal 45 while the fingers 77a and 77b perform a retreat operation, it is necessary to maintain postures of the fingers 77a and 77b synchronously with the operation of the arm body 18, and operation control becomes more complicated. Further, for the retreat operation, the wafer transfer robot 57 of the related art has to switch to the retreat operation of the arm body 18 after the lowering operation of the elevating mechanism 19 is completed, and a time lag is generated due to the switching of the operation from the elevating mechanism 19 to the arm body 18, and as a result, throughput decreases.

Figure 12A:
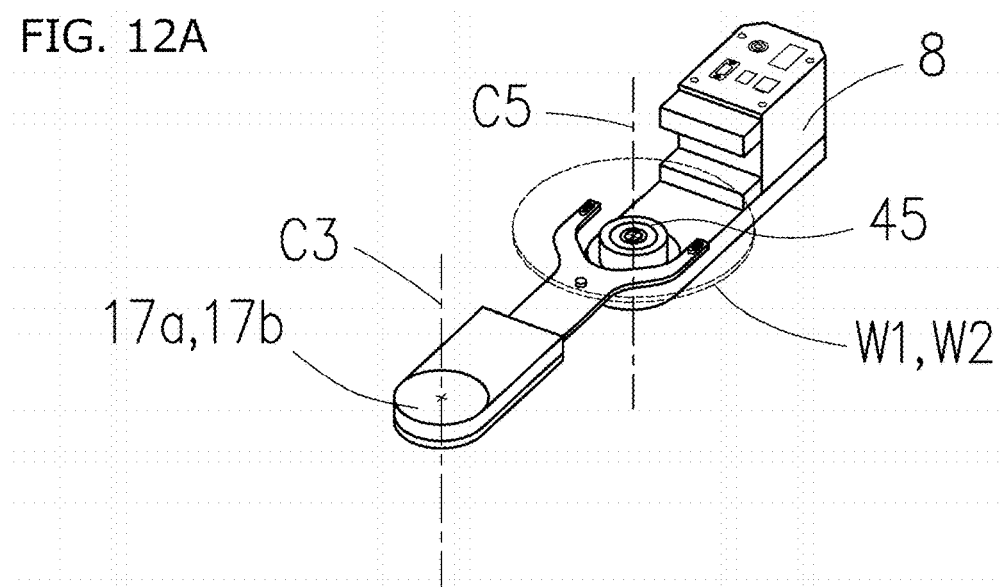
FIGS. 12A, 12B and 12C are a view showing a retreat operation performed by the wafer transfer robot according to one embodiment of the invention.
Figure 12B:
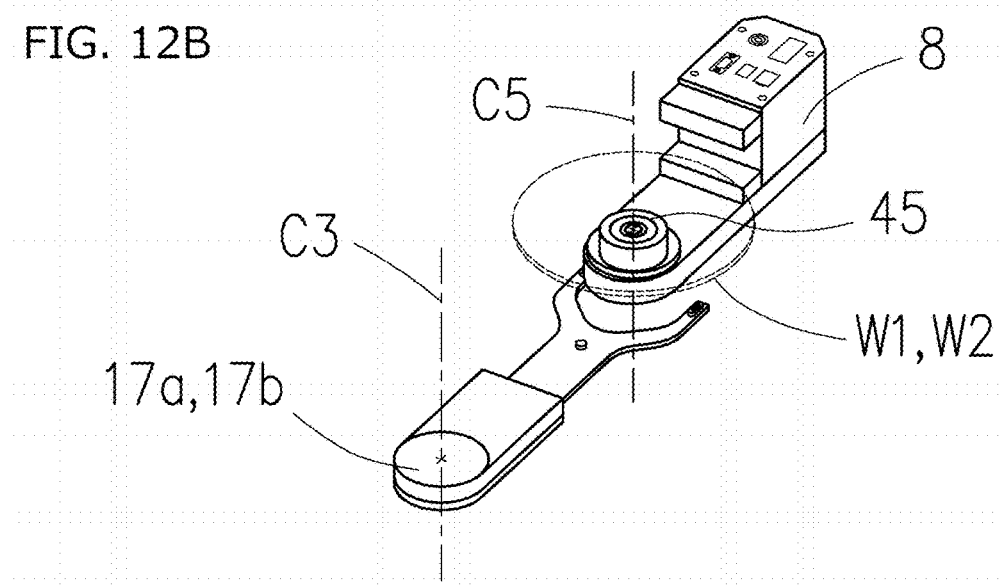
Figure 12C:
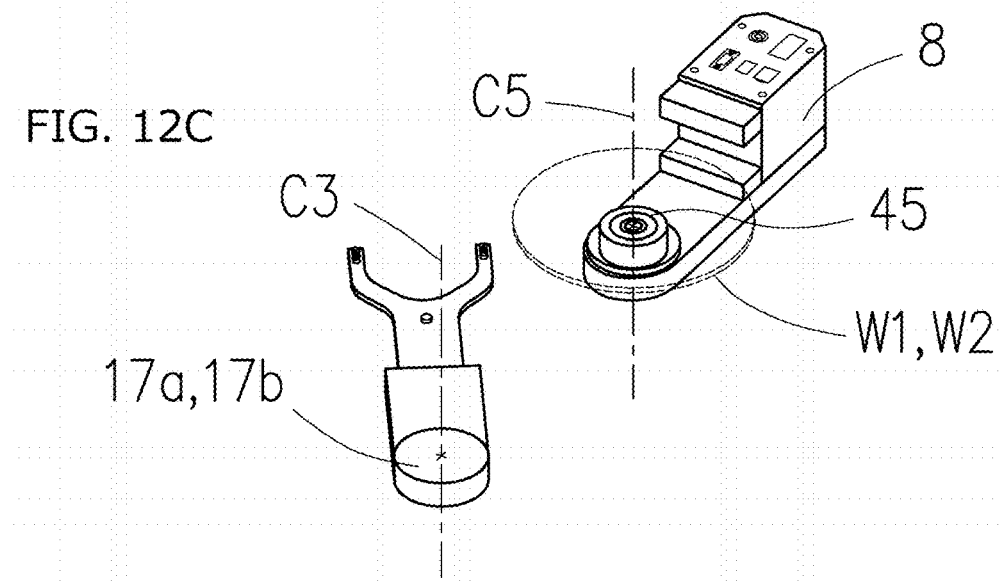

In the retreat operation of the wafer transfer robot 7 of the present embodiment, as shown in FIGS. 12A, 12B and 12C, the fingers 17a and 17b are moved to a predetermined position above the wafer pedestal 45 (FIG. 12A), and then even after the fingers 17a and 17b are lowered by the elevating mechanism 19 to place the wafer W1 or W2, the elevating mechanism 19 is lowered as it is without being stopped until the finger 17a or 17b is located below the aligner 8 (FIG. 12B). Then, thereafter, the fingers 17a and 17b are rotated since the risk of interference between the fingers 17a and 17b and the aligner 8 or the wafers W1 and W2 disappears (FIG. 12C). Therefore, unlike the related art, after the wafer W1 or W2 is placed on the aligner 8, it is not necessary to operate the arm body 18 (arms 24 and 26) in such a way to retreat the fingers 17a and 17b from an area close to the aligner while avoiding interference with the wafer W1 or W2 or with the aligner 8.

Accordingly, the operation time of the wafer transfer robot 7 can be shortened. Further, since the retreat operation in which the fingers are retreated to below the body portion of the aligner (FIGS. 12A and 12B) does not also require a complicated angular displacement operation of each of the arms 24 and 26 or of the fingers 17a and 17b, a trouble that each of the arms 24 and 26 or the finger 17a or 17b comes into contact with the back wall 12 or with the wafer pedestal 45 does not also occur. Incidentally, the angular displacement operation referred to here is a rotational operation of the first arm 24 with respect to the base 20, a rotational operation of the second arm 26 with respect to the first arm 24, or a rotational operation of the finger 17a or 17b with respect to the second arm 26, and the wafer transfer robot 7 performs the angular displacement operation to move the finger 17a or 17b or the wafer W held by the finger 17a or 17b, to a predetermined position.

A configuration in which the aligner 8 of the present embodiment does not include a mechanism that moves the wafer pedestal 45 in the horizontal direction has been provided as an example. However, the aligner can also be configured to include a mechanism that moves the wafer pedestal 45 in a direction parallel to the straight line L2 connecting the center P1 of the wafer W and the rotation center of the fingers 17a and 17b (X direction in FIG. 6) or in the direction orthogonal to the straight line L2 (Y direction in FIG. 6). Further, the aligner can also be configured to include a mechanism that moves the wafer pedestal 45 both in the direction parallel to the straight line L2 (the same X direction) and in the direction orthogonal to the straight line L2 (the same Y direction).

Figure 13A:
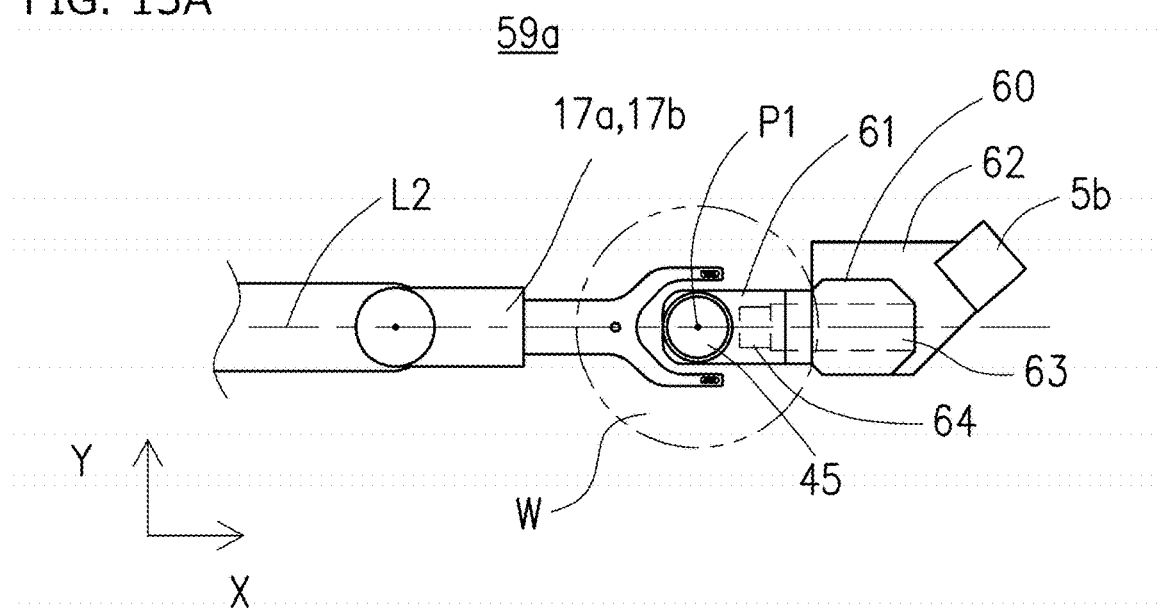
FIGS. 13A and 13B are a view showing an aligner including a first movement mechanism according to one embodiment of the invention.
Figure 13B:
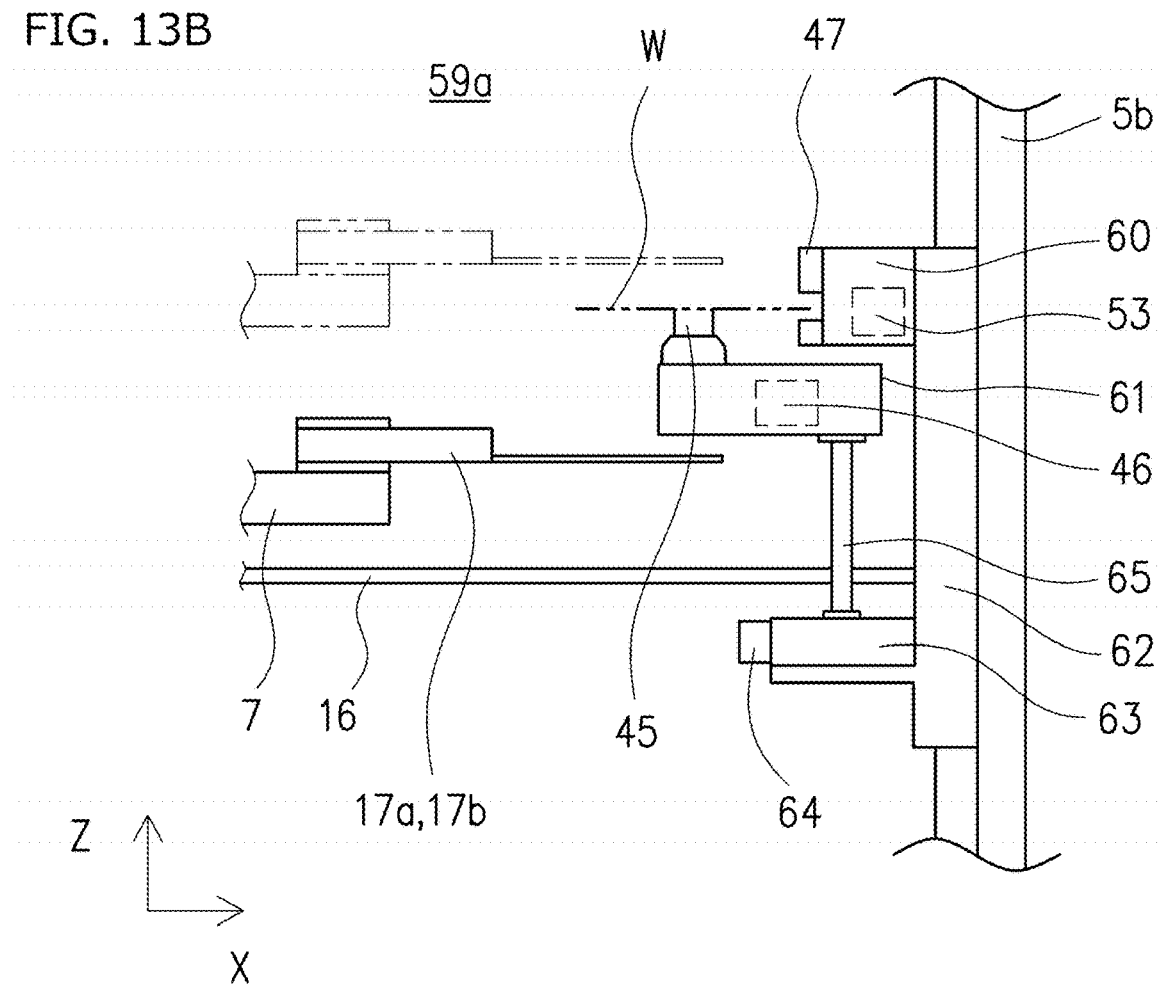

FIG. 13A is a plan view showing an aligner 59a including a first movement mechanism 63 that moves the wafer pedestal 45 in the direction parallel to the straight line L2, and FIG. 13B is a front view thereof. Incidentally, in FIGS. 13A and 13B, FIGS. 14A and 14B and FIG. 15, for convenience, the direction parallel to the straight line L2, a direction orthogonal to the straight line L2, and a direction orthogonal to the X direction and to the Y direction will be described as the X direction, the Y direction, and a Z direction (vertical direction), respectively. The aligner 59a of the present embodiment includes the same mechanism as that of the aligner 8, but the electric unit 60 accommodating the aligner control unit 53 or the wafer detection sensor 47 and the body portion 61 accommodating the drive mechanisms such as the wafer pedestal 45 and the aligner motor 46 are separated from each other. The body portion 61 is configured with the same width dimension D1 as that of the aligner 8 of the first embodiment when viewed from above. The electric unit 60 is fixed to an uppermost portion of a bracket 62 fixed to the vertical frame 5b, and the first movement mechanism 63 that moves the body portion 61 including the wafer pedestal 45 in the X direction is attached to a lowermost portion of the bracket 62.

The first movement mechanism 63 is formed of a motor 64 and a ball screw mechanism, and when the motor 64 operates, a ball screw connected to a rotary shaft of the motor 64 rotates, and a movable body screwed with the ball screw moves forward and backward in the X direction. A bottom surface of a body portion fixing base 65 is fixed to the movable body, and the body portion 61 is fixed to a top surface of the body portion fixing base 65. Incidentally, the motor 64 is a motor of which a drive shaft angle can be controlled, and operation of the motor 64 is controlled by the aligner control unit 53. In addition, it is desirable that the electric unit 60 and the body portion 61 are disposed in the substrate transfer area 14 above the differential pressure plate 16. Further, since there is a possibility that dust is generated due to operation of the first movement mechanism 63, it is desirable that the first movement mechanism 63 is disposed in the low pressure area 15 below the differential pressure plate 16. Accordingly, the risk that the dust generated by the first movement mechanism 63 adheres to the wafer W is reduced.

With this configuration, the wafer detection sensor 47 detects a rotational offset of the notch of the wafer W and a positional offset amount of the center of the wafer W in the X-Y direction, and a positional offset amount of the wafer W in the X-Y direction when the position of the notch has moved to a predetermined rotational position instructed in advance, and correction data to correct the positional offset in the X-Y direction are calculated. Next, the aligner 59a rotates the wafer W until the notch reaches the predetermined rotational position instructed in advance on the peripheral edge of the wafer W, to correct the rotational offset, and can further correct a positional offset of the wafer W in the X direction by moving the wafer pedestal 45 and the wafer W using the first movement mechanism 63.

In addition, after the aligner 59a has corrected the positional offset of the wafer W in the X direction, the fingers 17a and 17b have moved to a position where a positional offset in the Y direction is corrected, and then lift the wafer W from below, so that the wafer W can be held at the position where the positional offsets of the wafer W in the X direction and in the Y direction are corrected. Further, when a correction to move the fingers in the Y direction is performed, the fingers 17a and 17b that have placed the wafer W on the wafer pedestal 45 can move to below the body portion 61 without changing a posture in the horizontal direction by setting the gap ((D2−D1)/2) to be larger than a maximum allowable correction amount in the Y direction, so that transfer throughput of the wafer W can be improved.

Figure 14A:
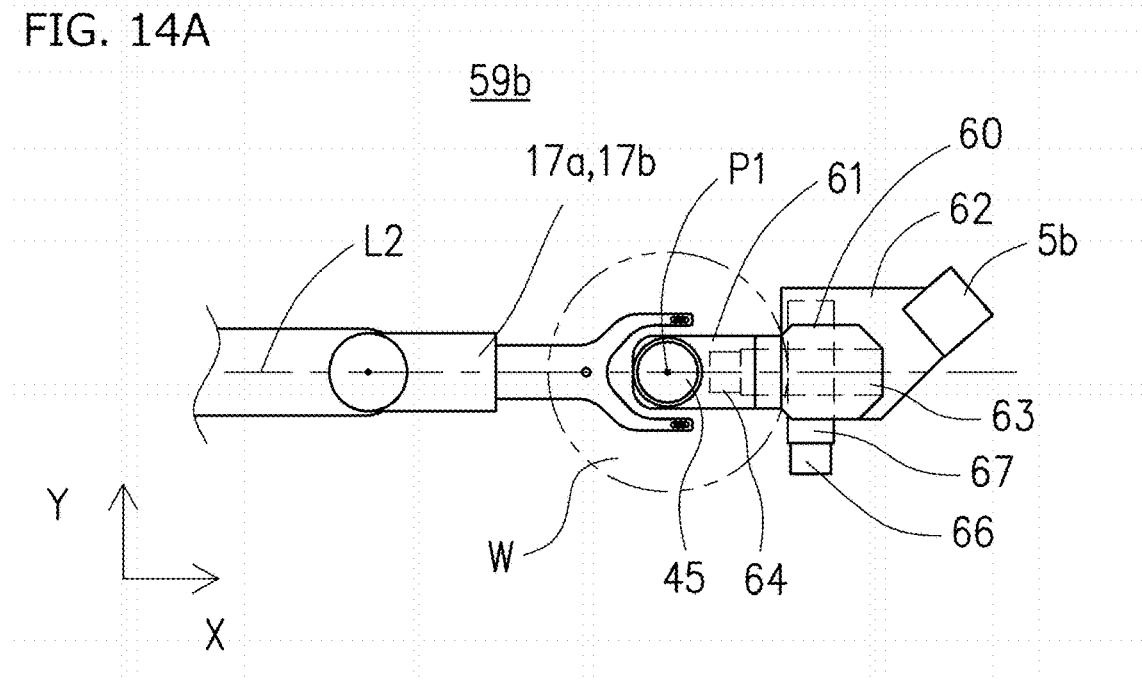
FIGS. 14A and 14B are a view showing an aligner including the first movement mechanism and a second movement mechanism according to one embodiment of the invention.
Figure 14B:
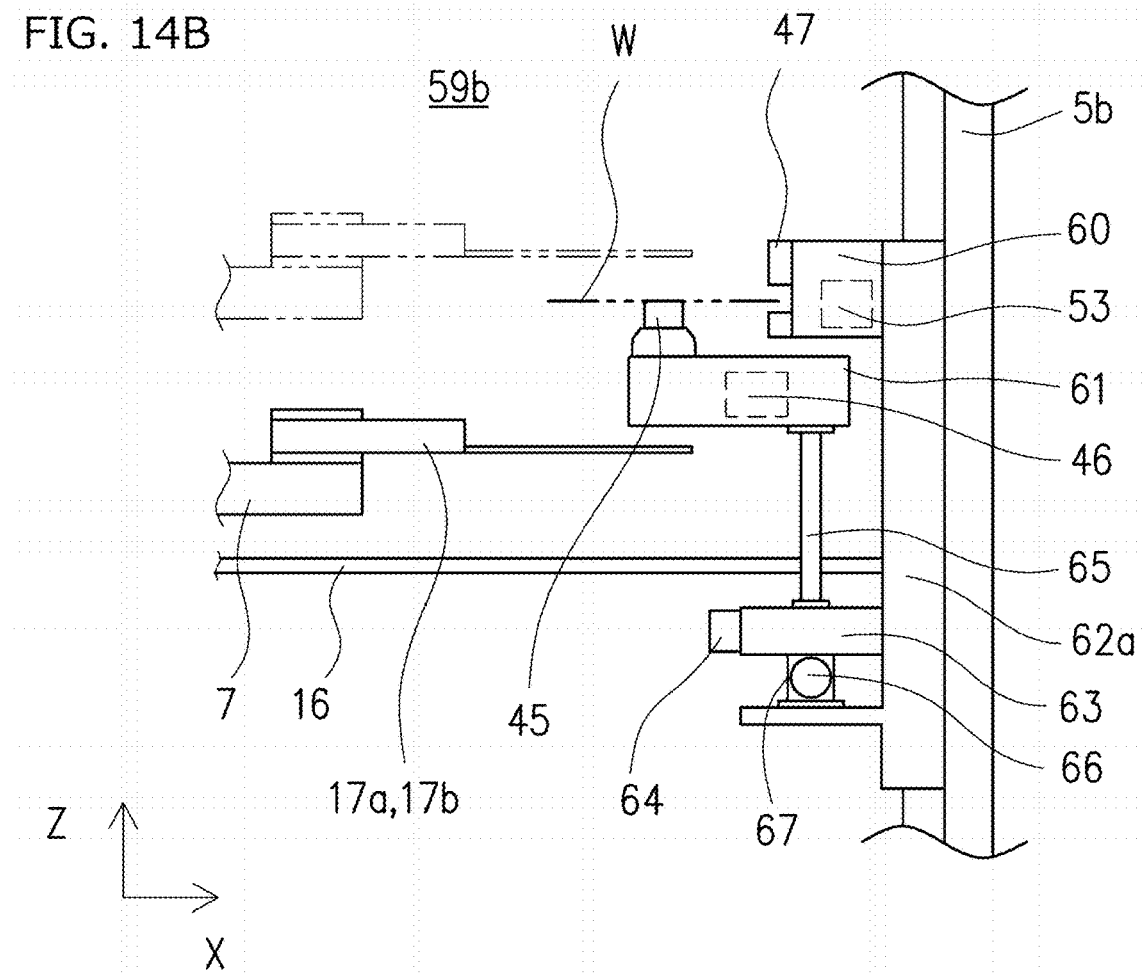

FIG. 14A is a view showing an aligner 59b including a second movement mechanism 67 below the first movement mechanism 63, the second movement mechanism moving the first movement mechanism 63 forward and backward in the Y direction, and FIG. 14B is a front view thereof. The second movement mechanism 67 has the same configuration as that of the first movement mechanism 63, and is attached to a lowermost portion of a bracket 62a. The second movement mechanism 67 is formed of a motor 66 and a ball screw mechanism, and when the motor 66 operates, a ball screw connected to the rotary shaft of the motor rotates, and a movable body screwed with the ball screw moves forward and backward in the Y direction. The first movement mechanism 63 is fixed to the movable body. The motor 66 is a motor of which an angle can be controlled, and operation of the motor 66 is controlled by the aligner control unit 53.

With this configuration, the wafer detection sensor 47 detects a position of the notch of the wafer W and an offset amount of the center of the wafer W, and a positional offset amount of the wafer W in the X-Y direction when the position of the notch has moved to a predetermined rotational position instructed in advance, and correction data to correct the positional offset in the X-Y direction are calculated. The position of the notch can be positioned at the predetermined rotational position instructed in advance by rotation of the wafer pedestal 45, and further, positional offsets of the wafer W in the X direction and in the Y direction can be corrected by operating the first movement mechanism 63 and the second movement mechanism 67. In addition, similarly to the aligners 8 and 59a of the first and second embodiments, since the fingers 17a and 17b that have placed the wafer W on the wafer pedestal 45 can move to below the body portion 61 without changing a posture in the horizontal direction, transfer throughput of the wafer W can be improved. Incidentally, since there is a possibility that dust that affects the wafer W is generated due to operation of the second movement mechanism 67, it is desirable that similarly to the first movement mechanism 63, the second movement mechanism 67 is disposed in the low pressure area 15 below the differential pressure plate 16.

Further, a configuration may be adopted in which the electric unit 60 and the body portion 61 are integrated and the first movement mechanism 63 and the second movement mechanism 67 integrally move the electric unit 60 and the body portion 61 in the X direction and in the Y direction. With this configuration, it is possible to obtain the same effects as those of the aligner 59a of the second embodiment or of the aligner 59b of a third embodiment. However, in the case of moving the wafer pedestal 45 to correct a positional offset of the wafer W, when the next wafer W is placed on the wafer pedestal 45, it is necessary to perform an operation of moving the wafer pedestal 45 to a predetermined position determined in advance by operating the first movement mechanism 63 and the second movement mechanism 67.

Figure 15:
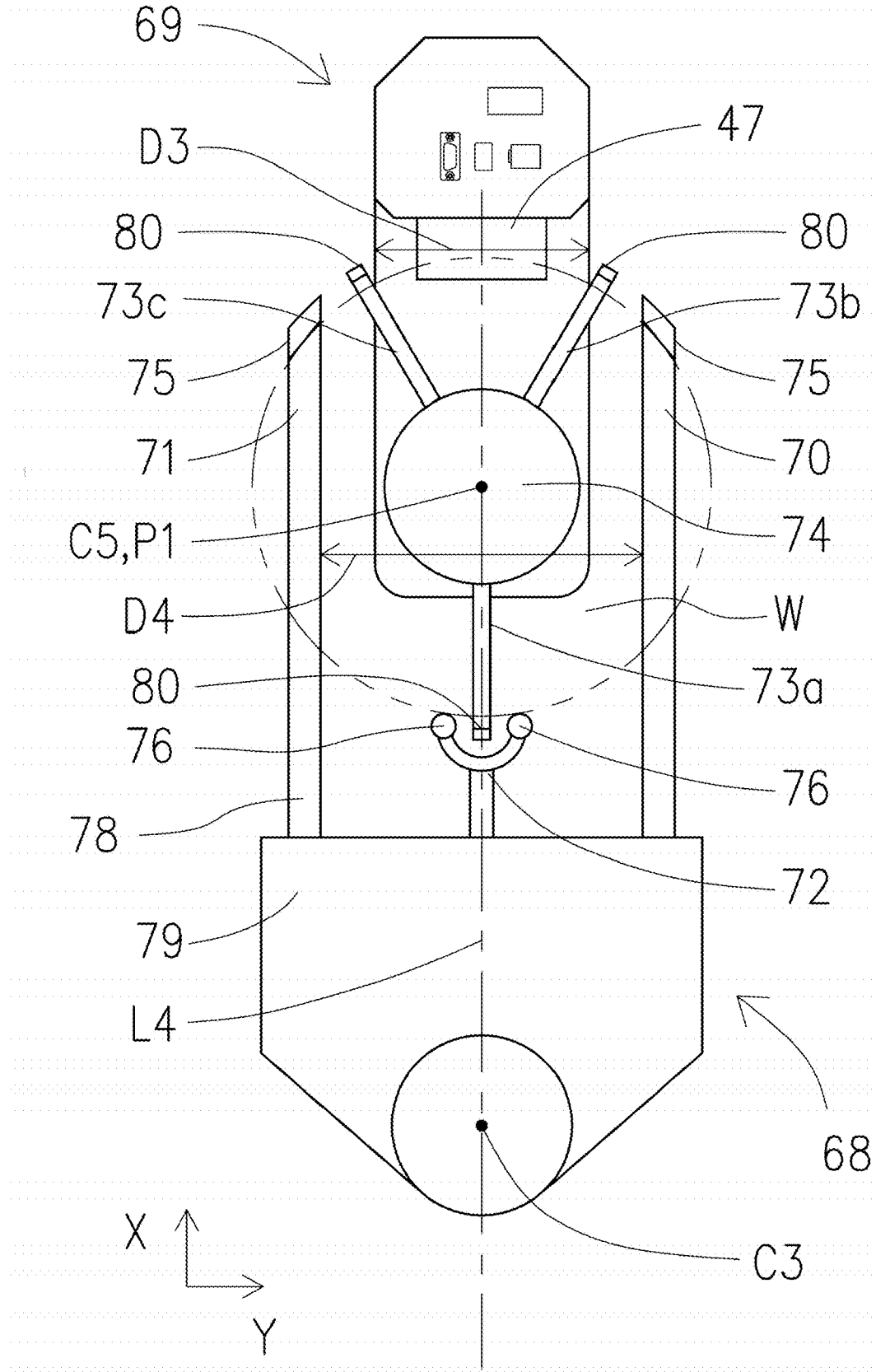
FIG. 15 is a view showing a clamping finger and a clamping aligner according to one embodiment of the invention.

In the transfer operation performed by the wafer transfer robot 7 and the aligner 8 of the present embodiment, the invention is not limited to the suction type fingers 17a and 17b that hold the wafer W with a vacuum suction force, and can also be applied to a so-called clamping finger 68 that holds the wafer W by gripping the peripheral edge of the wafer W. FIG. 15 is a plan view showing the clamping finger 68 and a clamping aligner 69 according to another embodiment of the invention. The clamping finger 68 of the present embodiment is formed of a holding portion 78 that holds the wafer W, and a wrist portion 79 that supports a proximal end of the holding portion 78. A proximal end of the wrist portion 79 is attached to the distal end portion of the second arm 26 so as to be rotatable around the rotation axis C3 as a rotation center, and is rotated by the finger drive motor 30 provided inside the second arm 26. The holding portion 78 that holds the wafer W includes a pair of wafer holding rods 70 and 71 disposed parallel to each other, and a clamping member 72 that mechanically grips the wafer W by pressing the peripheral edge of the wafer W against locking portions 75 at distal ends of the holding rods 70 and 71 using a biasing force of a spring.

In addition, the clamping aligner 69 of the present embodiment includes clamping bars 73a, 73b, and 73c that mechanically grip the peripheral edge of the wafer W using biasing forces of springs or the like, and a wafer pedestal 74 that rotates in a horizontal plane around a straight line C5 (hereinafter, referred to as the "rotation axis C5") as a rotation center extending in a vertical direction of the drawing sheet of FIG. 15, together with the clamping bars 73a, 73b, and 73c. When the wafer transfer robot 7 performs delivery of the wafer W between the wafer transfer robot 7 and the clamping aligner 69, the wafer transfer robot 7 operates the arm body 18 to move the clamping finger 68 to a position where the center P1 of the held wafer W coincides with the rotation axis C5 of the wafer pedestal 74 of the clamping aligner 69.

The pair of wafer holding rods 70 and 71 provided in the holding portion 78 of the clamping finger 68 are fixed to the wrist portion 79 so as to be line symmetric with each other with respect to a straight line L4 extending in a horizontal plane and connecting the rotation axis C3 of the clamping finger 68 and the rotation axis C5 of the wafer pedestal 74 in a plan view. In addition, locking members 75 that lock the peripheral edge portion of the wafer W pressed by the clamping member 72 is provided at the respective distal ends of the wafer holding rods 70 and 71. A distal end of the clamping member 72 is bifurcated into a Y shape in a plan view, and clamping pads 76 that come into contact with the peripheral edge portion of the wafer W are provided at the respective bifurcated distal ends. The clamping member 72 includes a biasing member and an actuator that drives the clamping member 72 toward or away from the wafer W, inside the wrist portion 79. When the clamping member 72 is moved toward the wafer by the actuator, the clamping member 72 is pushed out toward the wafer W by a biasing force of the biasing member, to grip the wafer W. In addition, the actuator operates the clamping member 72 away from the wafer W to retreat the clamping member 72 with respect to the wafer W, thereby releasing the gripping of the wafer W.

As for the mechanism that grips the wafer W and for the mechanism that rotates the gripped wafer W in the clamping aligner 69 of the present embodiment, known mechanisms can be used. Three clamping bars 73a, 73b, and 73c having the same length are radially disposed around the rotation axis C5 as an origin on the wafer pedestal 74, and locking members 80 that lock the wafer W are provided at respective distal ends of the clamping bars 73a, 73b, and 73c. In addition, the clamping bars 73a, 73b, and 73c each include an extendable and contractable mechanism, each of the clamping bars 73a, 73b, and 73c operates to extend when receiving the wafer W from the clamping finger 68, and the three clamping bars 73a, 73b, and 73c operates to contract when gripping the wafer W, thereby gripping the peripheral edge portion of the wafer W with each of the locking members 80. Further, the clamping aligner 69 includes the wafer detection sensor 47, and rotates the gripped wafer W in a horizontal plane to detect a position of the notch or the orientation flat formed at the peripheral edge portion of the wafer W, with the wafer detection sensor 47. Incidentally, since the clamping aligner 69 of the present embodiment is configured such that the three clamping bars 73a, 73b, and 73c grip the peripheral edge portion of the wafer W with equal gripping forces, the center P1 of the gripped wafer W at the instructed position coincides with the rotation axis C5 of the wafer pedestal 74 in a plan view.

When the clamping aligner 69 of the present embodiment is at a standby position for receiving the wafer W from the clamping finger 68, the locking member 80 fixed to the distal end of the first clamping bar 73a is disposed at a position which is between two clamping pads 76 disposed on the bifurcated distal end portions of the clamping member 72 provided in the clamping finger 68 and in which the locking member 80 does not interfere with the two clamping pads 76. In addition, the second clamping bar 73b and the third clamping bar 73c are disposed at positions where the second clamping bar 73b and the third clamping bar 73c do not come into contact with the pair of wafer holding rods 70 and 71 of the clamping finger 68, and further, are disposed to be symmetric with respect to the straight line L4 in a plan view. Incidentally, the clamping bars 73a, 73b, and 73c provided in the clamping aligner 69 of the present embodiment are each not disposed at equal angles, and are disposed, for example, such that an angle formed by the first clamping bar 73a and the second clamping bar 73b is 150°, an angle formed by the second clamping bar 73b and the third clamping bar 73c is 60°, and an angle formed by the third clamping bar 73c and the first clamping bar 73a is 150°. Incidentally, the angles formed by the clamping bars 73a, 73b, and 73c are not limited to these angles. In addition, the number of the clamping bars 73a, 73b, and 73c is not limited to 3. For example, the number of the clamping bars 73a, 73b, and 73c may be 3 or more, and a mode may be employed in which the number of the clamping bars 73a, 73b, and 73c is 2 and the number of the locking members 80 that grip the wafer W is 3 or more.

In addition, a separation distance D4 between the left and right wafer holding rods 70 and 71 provided in the clamping finger 68 of the present embodiment is formed to be larger than a dimension D3 of the wafer pedestal 74 of the clamping aligner 69 and of the body portion of the clamping aligner 69 in a width direction that is a direction orthogonal to the straight line L3. With this configuration, the clamping finger 68 delivers the wafer W to the clamping aligner 69, and then can move down to below the clamping aligner 69 in the vertical direction.

The embodiments of the invention have been described above in detail with reference to the drawings, but the invention is not limited to the embodiments, and can be changed in various forms without departing the concept of the invention. For example, in the embodiments, a case has been described in which the wafer W is transferred from the FOUP 2 to the wafer processing apparatus 3 via the aligner 8, but the invention can also be applied to a case where the wafer W is transferred from the wafer processing apparatus 3 to the FOUP 2 via the aligner 8. Further, for example, the aligner 8 may be configured to have various other inspection functions such as reading a wafer ID stamped on the wafer W, in addition to a function of detecting a positional offset of the wafer W and the notch.

What is claimed is:

1. A wafer transfer apparatus comprising:
    a frame defining a transfer space for a wafer;
    an aligner disposed within the transfer space, including
        a body portion extending in a horizontal direction and having one end fixed to the frame through a bracket,
        a shaft, at another end of the body portion opposite to the one end, to rotate about a rotation axis thereof,
        a wafer pedestal fixed to the shaft to hold the wafer, and
        a sensor on the body portion to detect a peripheral edge portion of the wafer; and
    a transfer robot to hold and transfer the wafer between a load port, the aligner, and a processing apparatus, wherein
    the transfer robot includes
        an arm body including at least two arms rotationally operably connected to each other at one end of each of the at least two arms,
        a finger rotatably attached to a distal end of the arm body to hold the wafer with a pair of wafer holding rods,
        an arm drive motor to operate a corresponding arm of the at least two arms,
        a finger drive motor to drive and rotate the finger in a horizontal plane, and
        an elevating drive motor to move the arm body in a vertical direction,
    the wafer pedestal is rotatably supported by the body portion of the aligner,
    a dimension of the body portion of the aligner in a width direction in an access area of the finger is smaller than a separation dimension between the pair of wafer holding rods, and
    the transfer robot is configured to, after driving the elevating drive motor to lower the finger to place the wafer, which is held by the finger, on the wafer pedestal,
        lower the finger to a position below the body portion of the aligner, and
        drive the finger drive motor to rotate the finger through a space directly below the shaft to transition to a next transfer operation.

2. The wafer transfer apparatus according to claim 1, wherein
    a difference between the separation dimension between the pair of wafer holding rods and the dimension of the body portion of the aligner is larger than an allowable offset dimension of the wafer.

3. The wafer transfer apparatus according to claim 2, wherein
    the aligner includes a fan or a pump for discharging air inside the aligner to an outside.

4. The wafer transfer apparatus according to claim 2, wherein
    the wafer pedestal has a flow path for vacuum-suctioning on an upper surface of the wafer pedestal to hold the wafer, and
    the finger has wafer holding pads to hold the wafer by vacuum-suctioning.

5. The wafer transfer apparatus according to claim 4, wherein the wafer holding pads are a pair of wafer holding pads for vacuum-suctioning the wafer, the finger further includes a wafer contact portion, a center of the wafer held by the finger is disposed inside a triangle connecting the pair of wafer holding pads and the wafer contact portion when viewed from above, and when the finger is located to deliver and receive the wafer to and from the wafer pedestal, a rotation center axis of the wafer pedestal is disposed inside the triangle when viewed from above.

6. The wafer transfer apparatus according to claim 4, wherein the aligner includes a motor to move the wafer pedestal in a horizontal plane.

7. The wafer transfer apparatus according to claim 2, wherein the aligner is a clamping aligner to pinch the peripheral edge portion of the wafer, and the finger is a clamping finger to pinch the peripheral edge portion of the wafer.

8. The wafer transfer apparatus according to claim 1, wherein the aligner includes a fan or a pump for discharging air inside the aligner to an outside.

9. The wafer transfer apparatus according to claim 1, wherein the wafer pedestal has a flow path for vacuum-suctioning on an upper surface of the wafer pedestal to hold the wafer, and the finger has wafer holding pads to hold the wafer by vacuum-suctioning.

10. The wafer transfer apparatus according to claim 9, wherein the wafer holding pads are a pair of wafer holding pads for vacuum-suctioning the wafer, the finger further includes a wafer contact portion, a center of the wafer held by the finger is disposed inside a triangle connecting the pair of wafer holding pads and the wafer contact portion when viewed from above, and when the finger is located to deliver and receive the wafer to and from the wafer pedestal, a rotation center axis of the wafer pedestal is disposed inside the triangle when viewed from above.

11. The wafer transfer apparatus according to claim 9, wherein the aligner includes a motor to move the wafer pedestal in a horizontal plane.

12. The wafer transfer apparatus according to claim 1, wherein the aligner is a clamping aligner to pinch the peripheral edge portion of the wafer, and the finger is a clamping finger to pinch the peripheral edge portion of the wafer.

13. The wafer transfer apparatus according to claim 1, wherein the transfer robot further includes a further finger disposed below the finger and rotatably attached to the distal end of the arm body to hold another wafer with a pair of second wafer holding rods, and the transfer robot is configured to move the further finger to be positioned above the wafer pedestal and simultaneously rotate the finger to a further position where the finger does not interfere with the aligner, drive the elevating drive motor to lower the finger and the further finger, place the another wafer, which is held by the further finger, on the wafer pedestal, after placing the another wafer on the wafer pedestal, drive the elevating drive motor to further lower the further finger to the position below the body portion of the aligner, and rotate the further finger through the space directly below the shaft to the further position where the further finger coincides with the finger.

14. A wafer transfer method of a wafer transfer robot for transferring a wafer between the wafer transfer robot and an aligner in a wafer transfer apparatus, the wafer transfer apparatus including a frame defining a transfer space for a wafer, the aligner disposed within the transfer space, including a body portion extending in a horizontal direction and having one end fixed to the frame through a bracket, a shaft, at another end of the body portion opposite to the one end, to rotate about a rotation axis thereof, a wafer pedestal fixed to the shaft to hold the wafer, and a sensor on the body portion to detect a peripheral edge portion of the wafer, and the wafer transfer robot including a finger including a pair of wafer holding rods, and an arm body, and to hold and transfer the wafer on the finger between a load port, the aligner, and a processing apparatus, the wafer pedestal being rotatably supported by the body portion of the aligner, and a width of the body portion of the aligner in an access area of the finger having a dimension smaller than a separation dimension between the pair of wafer holding rods, the wafer transfer method comprising:

a placement step of placing the wafer held on the finger, on the wafer pedestal by lowering the finger from above the aligner; and a retreat step of retreating the finger to below the body portion of the aligner by lowering the finger even after the wafer is placed on the wafer pedestal, and then of causing the finger to rotate in a horizontal plane through a space directly below the shaft to transition to a next transfer operation.

15. The wafer transfer method of the wafer transfer robot according to claim 14, further comprising:

a detection step of causing the aligner to detect a positional offset of the wafer by detecting the peripheral edge portion of the wafer held on the wafer pedestal, after the placement step; and a holding step of holding the wafer placed on the wafer pedestal by raising the finger retreated by the retreat step, to above the wafer pedestal after the detection step.

16. The wafer transfer method of the wafer transfer robot according to claim 15, further comprising:

a rotational offset correction step of causing the aligner to rotate the wafer pedestal in the horizontal direction so as to cancel a rotational offset of the wafer detected by the aligner, before the holding step.

17. The wafer transfer method of the wafer transfer robot according to claim 16, further comprising:

a positional offset correction step of causing the wafer transfer robot to move the finger in the horizontal direction so as to cancel the positional offset of the wafer detected by the aligner, before the holding step.

18. The wafer transfer method according to claim 16, further comprising:
- a positional offset correction step of causing the aligner to move the wafer pedestal in a horizontal plane so as to cancel the detected positional offset of the wafer, before the holding step.

19. The wafer transfer method of the wafer transfer robot according to claim 15, further comprising:
- a positional offset correction step of causing the wafer transfer robot to move the finger in the horizontal direction so as to cancel the positional offset of the wafer detected by the aligner, before the holding step.

20. The wafer transfer method according to claim 15, further comprising:
- a positional offset correction step of causing the aligner to move the wafer pedestal in a horizontal plane so as to cancel the detected positional offset of the wafer, before the holding step.

\* \* \* \* \*